United States Patent
Mori et al.

[11] Patent Number: 5,243,202
[45] Date of Patent: Sep. 7, 1993

[54] THIN-FILM TRANSISTOR AND A LIQUID CRYSTAL MATRIX DISPLAY DEVICE USING THIN-FILM TRANSISTORS OF THIS TYPE

[75] Inventors: Hisatoshi Mori, Fussa; Syunichi Sato, Kawagoe; Naohiro Konya, Hino; Ichiro Ohno, Hachioji; Hiromitsu Ishii, Tokorozawa; Kunihiro Matsuda, Sagamihara, all of Japan

[73] Assignee: Casio Computer Co., Ltd., Tokyo, Japan

[21] Appl. No.: 4,641

[22] Filed: Jan. 12, 1993

Related U.S. Application Data

[63] Continuation of Ser. No. 762,937, Sep. 19, 1991, abandoned, which is a continuation-in-part of Ser. No. 690,816, Apr. 23, 1991.

[30] Foreign Application Priority Data

| Apr. 25, 1990 | [JP] | Japan | 2-107376 |
|---|---|---|---|
| Apr. 25, 1990 | [JP] | Japan | 2-107377 |
| Sep. 7, 1990 | [JP] | Japan | 2-235675 |
| Sep. 12, 1990 | [JP] | Japan | 2-239940 |
| Sep. 12, 1990 | [JP] | Japan | 2-239941 |
| Sep. 14, 1990 | [JP] | Japan | 2-242576 |
| Sep. 14, 1990 | [JP] | Japan | 2-242577 |
| Sep. 21, 1990 | [JP] | Japan | 2-250381 |
| Sep. 21, 1990 | [JP] | Japan | 2-250383 |
| Mar. 28, 1991 | [JP] | Japan | 3-87248 |

[51] Int. Cl.[5] .................................... H01L 27/01
[52] U.S. Cl. ........................................ 257/59; 257/60; 257/768; 257/771; 359/87
[58] Field of Search .................. 357/23.7; 257/59, 60, 257/411, 768, 771; 359/59, 87

[56] References Cited

U.S. PATENT DOCUMENTS

| 3,853,496 | 12/1974 | Kim | 357/54 |
|---|---|---|---|
| 5,057,889 | 10/1991 | Yamada et al. | 357/23.7 |
| 5,076,666 | 12/1991 | Katayama et al. | 357/23.7 |
| 5,124,779 | 6/1992 | Furukawa et al. | 257/77 |
| 5,148,259 | 9/1992 | Kato et al. | 257/771 |
| 5,150,233 | 9/1992 | Enomoto et al. | 359/54 |

FOREIGN PATENT DOCUMENTS

| 0301571 | 2/1989 | European Pat. Off. |
| 0342796 | 11/1989 | European Pat. Off. |
| 55-138257 | 10/1980 | Japan |
| 61-183433 | 8/1986 | Japan |
| 61-1185723 | 8/1986 | Japan |
| 63-221669 | 9/1988 | Japan |

OTHER PUBLICATIONS

Thin Solid Films, vol. 168, No. 2, Jan. 15, 1989, pp. 281-289; C.-S. Yoo et al, "Factural experimental investigation of plasma-enhanced chemical vapor deposition of silicon nitride thin films".

Solid State Technology, vol. 28, No. 6, Jul. 1985, pp. 197-203; B. Gorowitz et al, "Applications of Plasma Enhanced Chemical Vapor Deposition in VLSI".

Solid State Technology, vol. 23, No. 4, Apr. 1980, pp. 133-136, A. K. Sinha, "Plasma Deposited Polycrystalline Silicon Films".

Solid State Technology, vol. 23, No. 4, Apr. 1980, pp. 137-142, K. M. Mar et al, "Properties of Plasma Enhancement CVD Silicon Nitride: Measurements and Interpretations".

(List continued on next page.)

Primary Examiner—Andrew J. James
Assistant Examiner—Courtney A. Bowers
Attorney, Agent, or Firm—Frishauf, Holtz, Goodman & Woodward

[57] ABSTRACT

A thin-film transistor comprises a gate electrode formed on a glass substrate, a gate insulating film formed essentially over an entire surface of the substrate to cover the gate electrode, a non-single-crystal silicon semiconductor film placed on the gate insulating film to cover the gate electrode; and a drain electrode and a source electrode spaced a specified distance apart on the semiconductor film and electrically connected to the semiconductor film so as to form the channel region of the transistor. The gate electrode is made of titanium-containing aluminum.

19 Claims, 21 Drawing Sheets

OTHER PUBLICATIONS

Journal of Vacuum Science and Technology: Part B, vol. 6, No. 2, pp. 517–523, J. Dresner, "Plasma deposition of SiO2 gate insulators for a-Si thin-film transistors".

Thin Solid Films, vol. 147, No. 3, Mar. 1987, pp. 259–266, D. J. Eagle, et al "Production of silicon oxides from the glow discharge decomposition of silane and NO2".

Journal of the Electrochemical Society, vol. 124, Apr. 1978, pp. 601–608, A. K. Sinha et al, "Reactive Plasma Deposited Si-N Films of MOS-LSI Passivation".

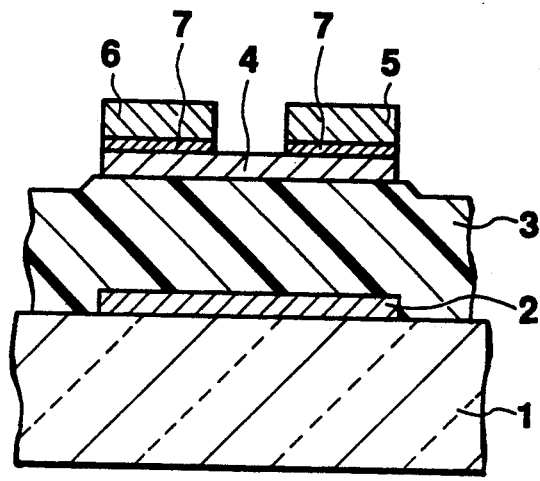
FIG.1 *(PRIOR ART)*
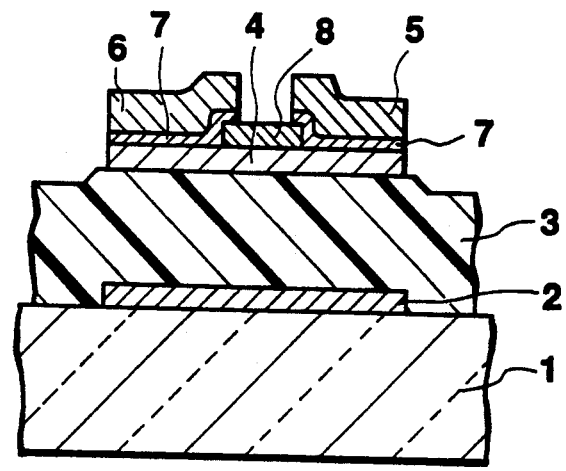
FIG.2 *(PRIOR ART)*

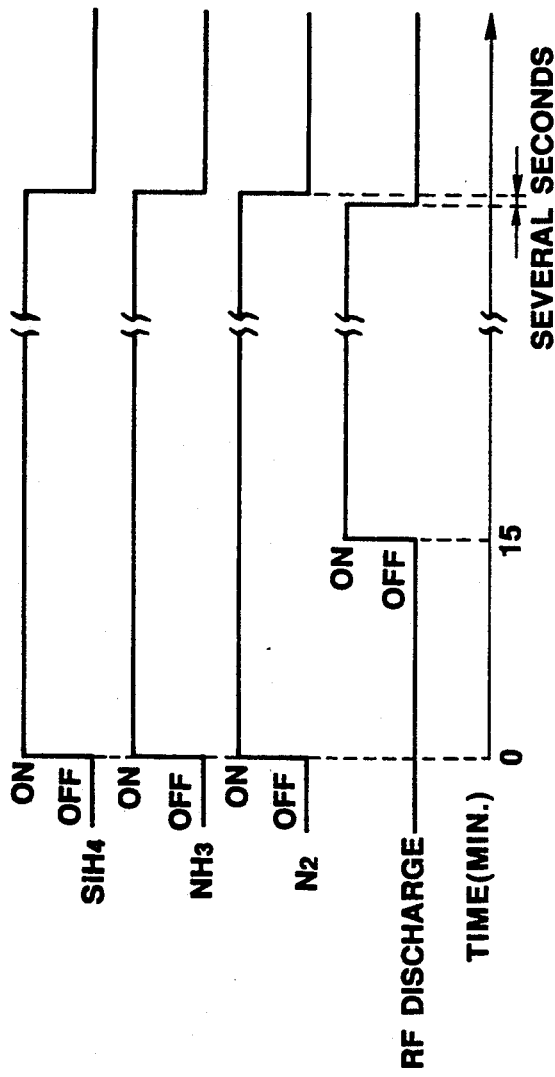
FIG. 3 *(PRIOR ART)*
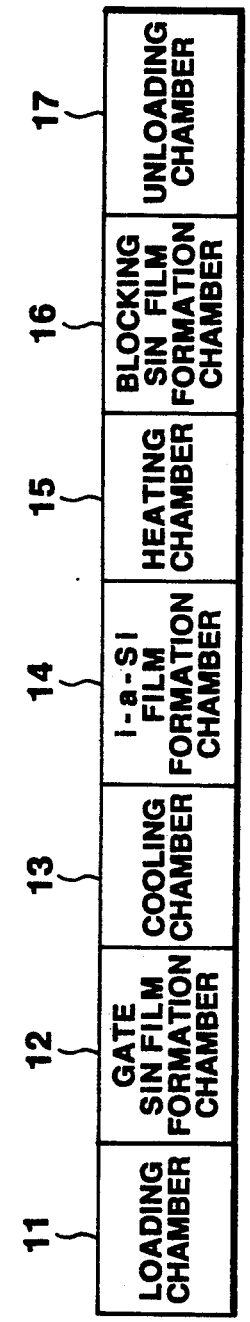
FIG. 4 *(PRIOR ART)*

(a-Si:H FILM FORMATION)

($n^+$-a-Si FILM FORMATION)

THIN-FILM TRANSISTOR AND A LIQUID CRYSTAL MATRIX DISPLAY DEVICE USING THIN-FILM TRANSISTORS OF THIS TYPE

This application is a continuation of application Ser. No. 07/762,937, filed Sep. 19, 1991, and now abandoned which is a continuation-in-part of application Ser. No. 07/690,816, filed Apr. 23, 1991.

BACKGROUND OF THE INVENTION

1. Field of the Invention

This invention relates to a thin-film transistor and an active matrix liquid crystal device provided with thin-film transistors of this type.

2. Description of the Related Art

Thin-film transistors (hereinafter, referred to as TFTs) are broadly divided into the stagger type, the reverse stagger type, the coplanar type, and the reverse coplanar type. Of these, the arrangement of the reverse stagger type is shown in FIGS. 1 and 2 and will be explained below.

Referring to FIG. 1, a gate electrode 2 consisting of a metal such as tantalum or chromium is formed on an insulating substrate 1 made of glass or the like, and a gate insulating film 3 is formed on the gate electrode 2. An i-type semiconductor film 4 consisting of i-type amorphous silicon (i-a-Si) is formed on the gate insulating film 3 so as to oppose the gate electrode 2. Source and drain electrodes 5 and 6 made of a metal such as chromium are formed on the i-type semiconductor film 4, respectively, through n-type semiconductor layers 7 and are spaced apart from each other by a predetermined distance to form a channel region. Each n-type semiconductor layer 7 consists of n-type amorphous silicon (n+-a-Si) doped with an impurity. A protective layer (not shown) is formed to cover the entire structure.

This type of thin-film transistor and a TFT matrix array composed of these TFTs arranged in matrix have been manufactured by the method described below. Table 1 lists the requirements concerning the manufacturing steps for a conventional thin-film transistor and a TFT matrix array. In this case, the reverse stagger type of FIG. 1 is taken up as an example.

STEP 1

A gate metal film is formed out of a hard metal, such as Cr (chromium), Ta (tantalum), or Mo (molybdenum), on a glass substrate in the temperature range of 100° to 200° C., using an evaporation or spattering apparatus. Then, the gate metal film is patterned to form a gate electrode and gate interconnections.

STEP 2

Then, on the substrate, an SiN (silicon nitride) film is formed in the temperature range of 300° to 350° C. with the RF discharging power density range of 120 to 130 mW/cm$^2$, using a plasma CVD apparatus, to produce a fine-quality gate insulating film with a high gate breakdown voltage.

STEP 3

Next, on the gate insulating film (SiN film), an a-Si (amorphous silicon) layer is formed out of hydrogenated a-Si (a-Si:H) as a semiconductor layer in a temperature of about 250° C. with the RF discharging power density range of 40 to 50 mW/cm$^2$, using the plasma CVD apparatus. The reason why the a-Si layer is formed at about 250° C. is that a higher film-forming temperature impairs the semiconductor characteristics because of a reduction in the hydrogen content of the a-Si layer and that a lower film-forming temperature degrades the quality of the a-Si film.

STEP 4

Next, on the a-Si layer, an n+-a-Si (n-type impurity-doped amorphous silicon) layer is formed as an ohmic contact layer under the same conditions as those for the a-Si layer (a film-forming temperature of about 250° C. with the RF discharging power density range of 40 to 50 mW/cm$^2$), using the plasma CVD apparatus.

STEP 5

Then, on the n+-a-Si layer, a source and drain metal film of, for example, Cr, is formed in the temperature range of 100° to 200° C. with the evaporation or spattering apparatus. After this, the source and drain metal film, and the underlying n+-a-Si layer and a-Si layer are patterned so as to form a semiconductor layer and then the source and drain metal film and n+-a-Si layer are separated into a source and drain electrodes.

STEP 6

Next, a transparent conducting film, such as an ITO film, to serve as a pixel electrode, is formed in the temperature range of 100° to 200° C., using the evaporating or spattering apparatus. Then, the ITO film is patterned to produce a pixel electrode one of whose edges overlaps the source electrode.

STEP 7

Next, an SiN film is formed as an interlayer insulating film that insulates the gate interconnection from the drain interconnection under the same conditions as those for the gate insulating film (the film-forming temperature range of 300° to 350° C. with the RF discharging power density range of 120 to 130 mW/cm$^2$), using the plasma CVD apparatus. Following this, a contact hole reaching the drain electrode is made in the interlayer insulating film.

STEP 8

Then, on the interlayer insulating film, Ti (titanium) and Al (aluminum) films are formed in sequence in the temperature range of 100° to 200° C., using the evaporating or spattering apparatus. After this, the Ti and Al films are patterned to produce a drain interconnection connected to the drain electrode through the contact hole.

STEP 9

Next, an SiN film is formed as a protective insulating film in the temperature range of 300° to 350° C. with the RF discharging power density range of 120 to 130 mW/cm$^2$, using the plasma CVD apparatus. This completes a thin-film transistor.

Although the above-described manufacturing steps are those for the reverse stagger thin-film transistor, the same conditions as shown in Table 1 have also been used in forming the gate insulating films and semiconductor layers of other types of thin-film transistors: the reverse coplanar type, the stagger type, and the coplanar type, with the gate, source, and drain electrodes being made of a hard metal such as Cr, Ta, or Mo.

In the manufacturing steps for TFTs noted above, a silicon nitride film is used for the gate insulating film 3, blocking layer 8 (refer to the TFT of FIG. 2), interlayer insulating film (not shown), and protective insulating film (not shown), and a silicon oxide film may be used as needed.

In each of these conventional TFTs, a silicon-based thin film such as an SiN film and an SiO film is formed by a plasma CVD method. This plasma CVD method is a method of supplying a process gas to a chamber in which a substrate heated to a predetermined temperature is set, causing a high-frequency glow discharge (RF discharge) upon supply of an RF current so as to set the process gas in a plasma state while the pressure of the process gas is controlled to a predetermined value, and depositing a silicon compound on the substrate, thereby forming a silicon-based thin film.

The process gas consists of a main reaction gas serving as a source gas for a film to be formed and a carrier gas for diluting the main reaction gas to obtain the plasma state. In order to form the SiN film, monosilane (SiN) gas and ammonia (NH$_3$) gas constitute a main reaction gas, and nitrogen (N$_2$) gas is used as a carrier gas. In order to form the SiO film, monosilane (SiH$_4$) gas and the laughing (N$_2$O) gas constitute a main reaction gas, and nitrogen (N$_2$) gas is used as a carrier gas.

Formation of the above silicon-based thin film is performed by the following steps as indicated by supply of the process gas and the RF discharge timings in FIG. 3.

A substrate heated to a predetermined temperature is set in a chamber, and the chamber is evacuated. The process gas as a gas mixture of the main reaction gas and the carrier gas is supplied and controlled to have a predetermined pressure. When about 15 minutes for stabilizing the pressure of the process gas and the substrate temperature elapse, an RF current is supplied to start an RF discharge, thereby generating a plasma and starting deposition of a silicon-based thin film. When a period of time required for depositing this thin film to a predetermined thickness elapses, supply of the RF current is stopped to interrupt the RF discharge. With a lapse of a few seconds, supply of the process gas is stopped.

In order to obtain a dense silicon-based thin film (especially a silicon nitride thin film) which is free from defects and has a high breakdown voltage, the silicon nitride thin film is formed at a substrate temperature of about 350° C. and an RF power of 120 to 130 mW/cm$^2$.

A composition ratio (Si/N) of the number of silicon (Si) atoms to the number of nitride (N) atoms of the resultant silicon nitride film has a value close to a stoichiometric ratio (Si/N=0.75) of the chemically stablest silicon nitride (SiN). The obtained silicon nitride film is dense, is free from defects and has a high breakdown voltage.

Since film formation is performed while the substrate temperature is kept maintained at 350° C., the substrate must be gradually heated not to cause defects such as distortion and cracks of the substrate. In addition, the substrate must be cooled over a long period of time longer than the heating time so as to prevent the silicon nitride film from being cracked by a stress caused by a difference between the thermal expansion coefficients of the substrate and the silicon nitride film. Therefore, according to the conventional film formation method, heating and cooling periods of the substrate are prolonged to degrade the formation efficiency of silicon-based thin films, resulting in low productivity.

FIG. 2 shows an improvement of the inverted staggered type TFT shown in FIG. 1. This TFT includes a blocking layer 8 consisting of an insulating film in a region constituting the channel region of the i-type semiconductor layer 4. Other portions of this TFT are the same as those in FIG. 1, and the same reference numerals as in FIG. 1 denote the same parts in FIG. 2.

The above method of forming the silicon-based thin film is used in the fabrication step of the TFT showes in FIG. 2. Steps in manufacturing this TFT will be described below.

A metal film consisting of chromium (Cr), tantalum (Ta), molybdenum (Mo) or the like is formed on a substrate 1 by a sputtering apparatus and is patterned by a photoetching method, thereby forming a gate electrode 2 and a gate line portion connected to this gate electrode 2.

A gate insulating film 3, an i-type semiconductor layer 4, and a blocking insulating film 8 are sequentially formed on the substrate 1 by a plasma CVD apparatus.

The blocking insulating film 8 is patterned by a photoetching method to leave the blocking insulating film 8 in only the channel region of the i-type semiconductor layer 4.

An n-type semiconductor layer 7 is formed on the i-type semiconductor film 4 by a plasma CVD apparatus and a metal film made of chromium, tantalum, or molybdenum serving as source and drain electrodes 5 and 6 is formed on the n-type semiconductor layer 7 by a sputtering apparatus. The metal film and the i-type semiconductor layer 7 are patterned by a photoetching method to form source and drain electrodes 5 and 6.

The i-type semiconductor layer 4 is patterned in the form of a transistor to finish a thin film transistor or TFT.

During the manufacturing process of the above TFT, the gate insulating film 3 and the blocking layer 8 are made of SiN films, and the i-type semiconductor film 4 comprises a hydrogenated amorphous silicon (a-Si:H) film. The n-type semiconductor film 7 comprises an n+-type a-Si film. The SiN films are formed at a substrate temperature of 350° C. and an RF discharge power density of 120 to 130 mW/cm$^2$ so as to obtain dense films having high breakdown voltages. The hydrogenated amorphous silicon (i-a-Si) film is formed at a substrate temperature of about 250° C. and an RF discharge power density of 40 to 50 mW/cm$^2$ to as to prevent a decrease in hydrogen content. The n+-type a-Si film is formed under the same conditions as those of the i-a-Si film. In this manner, when a plurality of films are continuously formed on one substrate at different substrate temperatures during film formation, a plasma CVD apparatus having a schematic arrangement shown in FIG. 4 is used. FIG. 4 shows the plasma CVD apparatus for continuously forming the gate insulating film 3, the i-type semiconductor film 4, and the blocking layer 8.

This plasma CVD apparatus comprises a substrate loading chamber 11, a silicon nitride formation chamber (to be referred to as a gate insulating film formation chamber hereinafter) 12 for forming the gate insulating film 3, a substrate cooling chamber 13, an amorphous silicon formation chamber (to be referred to as an i-type semiconductor formation chamber hereinafter) 14 for forming the i-type semiconductor film 4, a substrate heating chamber 15, a silicon nirtride film formation chamber (to be referred to as a blocking layer formation chamber hereinafter) 16 for forming the blocking layer 8, and a substrate unloading chamber 17. These chambers are continuously formed.

The gate insulating film 3, the i-a-Si layer 4, and the blocking layer 8 are formed by this plasma CVD apparatus in the following manner.

A substrate is loaded in the substrate loading chamber 11 and is heated to an SiN film formation temperature (about 350° C.). The heated substrate is transferred to the gate insulating film formation chamber 12, and the gate insulating film 3 is formed under the above film formation conditions.

The substrate is then transferred to the substrate cooling chamber 13, and the substrate temperature is decreased to an i-a-Si layer formation temperature (about 250° C.), and the cooled substrate is transferred to the i-type semiconductor film formation chamber 14, and the i-type semiconductor film 4 is formed under the above conditions.

The substrate is then transferred to the substrate heating chamber 15 to heat the substrate to an SiN film formation temperature (about 350° C.). The heated substrate is transferred to the blocking layer formation chamber 16, and the blocking layer 8 is formed under the above conditions.

The substrate is then transferred to the substrate unloading chamber 17 and cooled to an ambient temperature (room temperature). The cooled substrate is removed outside the substrate unloading chamber 17.

In this case, it takes a long period of time to gradually heat the substrate in the loading chamber 11 and the substrate heating chamber 15 and to gradually cool the substrate in the substrate cooling chamber 13 and the substrate unloading chamber 17 so as to prevent cracks caused by a heat stress acting on the SiN film and the i-a-Si layer formed on the substrate.

When the inverted staggered type thin film transistor having no blocking insulating layer 8 shown in FIG. 1 is to be formed, the n-type amorphous silicon layer (to be referred to as an n+-a-Si layer hereinafter) serving as the n-type semiconductor layer 7 is formed immediately after the i-type semiconductor film 4 is formed. The film formation conditions of the n+-a-Si layer can be the same as those of the i-a-Si layer. Therefore, the gate insulating film, the i-type semiconductor layer, and the n-type semiconductor layer of the TFT in FIG. 1 are formed by a plasma CVD apparatus arranged such that the substrate heating chamber 15 and the blocking layer formation chamber 16 are eliminated from the plasma CVD apparatus in FIG. 4, and an n+-a-Si layer formation chamber is arranged between the i-type semiconductor film formation chamber 14 and the substrate unloading chamber 17.

In this staggered type thin film transistor, after the source and drain electrodes and the n+-a-Si layer formed thereon are sequentially formed, the i-a-Si layer and the gate insulating film are sequentially formed, and a gate electrode is formed thereon. Therefore, the i-a-Si layer and the gate insulating film of this staggered type TFT can be formed by a plasma CVD apparatus having contiguous chambers, i.e., a substrate loading chamber, an i-type semiconductor film formation chamber, a substrate heating chamber, a gate insulating film formation chamber, and a substrate unloading chamber.

According to the above conventional method of manufacturing a thin film transistor, the gate insulating film is formed at a film formation temperature of about 350° C., and the i-type semiconductor film is formed at the film formation temperature of about 250° C. For this reason, for example, in the manufacture of the inverted staggered type thin film transistor, the substrate on which the gate insulating film is formed in the gate insulating film formation chamber 12 is adjusted to a temperature at which the i-type semiconductor film can be formed, and the temperature-adjusted substrate must be transferred to the i-type semiconductor film formation chamber 14. For this reason, the conventional plasma CVD apparatus includes the substrate cooling chamber 13 formed between the gate insulating film formation chamber 12 and the next i-type semiconductor film formation chamber 14 to cool the substrate having the gate insulating film thereon to an i-type semiconductor film formation temperature. Since the substrate must be gradually cooled over a long period of time, as described above, it takes a long period of time to cool the substrate having the gate insulating film formed at a temperature of about 350° C. to a temperature of about 250° C.

The above problem is also posed by the manufacture of the staggered type thin film transistor. In this case, the substrate having the i-a-Si film formed in the i-type semiconductor film formation chamber is heateto the gate insulating film formation temperature in the substrate heating chamber, and the heated substrate must be transferred to the gate insulting film formation chamber. Since this substrate heating must be slowly performed over a long period of time, it takes a long period of time to heat the substrate having the i-a-Si layer formed at the film formation temperature of about 250° C. to the temperature of about 350° C.

For this reason, the conventional TFT manufacturing method cannot manufacture thin film transistors with high efficiency.

As described above, making the gate, source, and drain electrodes out of a hard metal with a high melting point, such as Cr, Ta, or Mo, increases the cost of producing thin-film transistors because such hard metals are expensive. In addition, since those hard metals have a high resistivity, the gate electrode and the source and drain electrodes have a high impedance, which causes large voltage drops, impairing the operating characteristics (particularly the response characteristic) of a thin-film transistor. Further, TFT arrays have the problem that a delay in the scanning signal due to the impedance of the scanning signal line makes it impossible to control the operation of the TFTs arranged in matrix.

It has been proposed that Al, which is less expensive and of a low resistivity, should be used for the gate electrode and the source and drain electrodes. However, there is a problem: when an Al film is heat-treated at several hundred degrees centigrade, then protuberances called hillocks appear in the surface, resulting in the rough surface.

Since the gate insulating film (SiN film) of the thin-film transistor is formed at about 350° C. with the plasma CVD apparatus as described above, use of, for example, Al for the gate electrode of the reverse stagger thin-film transistor permits hillocks to appear on the surface of the gate electrode (Al film) during formation of the gate insulating film after the gate electrode has been made. Those hillocks cause defects in the gate insulating film, short-circuiting the gate electrode with the semiconductor layer and the source electrode with the drain electrode. The same holds true for thin-film transistors of the reverse coplanar type, the stagger type, and the coplanar type. That is, for those types of thin-film transistors, use of Al for the lower electrodes (the gate electrode for the reverse coplanar thin-film transistor, and the source and drain electrodes for the stagger and coplanar thin-film transistors) made before the formation of the gate insulating film allows hillocks to develop on the surface of the electrode (Al film) at the time of forming the gate insulating film (SiN film) in a subsequent step, resulting in defects in the gate insulating film.

For this reason, it has been impossible to use Al for the gate electrode and the source and drain electrodes.

SUMMARY OF THE INVENTION

An object of the present invention is to provide a TFT that achieves a good operating characteristics by lowering the resistance of the electrodes without causing defects in the gate insulating film.

Another object of the present invention is to provide a liquid crystal display device that assures stable operation by lowering the resistances of the electrodes of TFTs, the scanning signal lines connected to the TFTs, and/or the data signal lines without causing defects in the gate insulating films.

The foregoing object is accomplished by a thin-film transistor comprising: an insulating substrate; a non-single-crystal silicon semiconductor film placed above the substrate; an insulating film placed on the semiconductor film; and at least three electrodes including a pair of first electrodes and a second electrode, the pair of first electrodes being spaced a specified distance apart in a plane and electrically connected to the semiconductor film to form the channel region of the transistor therebetween, the second electrode being placed to sandwich at least the insulating film between itself and the pair of first electrodes, either the first electrode pair or the second electrode being formed on the substrate, and at least the electrode or electrode pair on the substrate being made of titanium-containing aluminum.

With this arrangement, since one or two of the electrodes on the surface of the substrate are made of titanium-contianing aluminum, this makes Al crystal grains finer, smoothing the film surface during film formation. Further, titanium is segregated at the aluminum crystal grain boundary, which increases the lattice deformation at the boundary, absorbing the compressive stress in the film. As a result, no hillock develops due to heating after the film formation. Use of aluminum, which has a low resistivity and presents a small increase in the resistance even when containing titanium, lowers the resistance of the electrode, thereby making the TFT operating characteristics better.

The titanium content of the titanium-containing aluminum is selected according to a temperature to which the substrate is heated after the electrodes on the substrate surface have been made. For example, when electrode is a gate electrode and a gate insulating film on the gate electrode is made of a silicon nitride film in the substrate temperature range of 250° to 270° C., the gate electrode may be made of titanium-containing aluminum with a titanium content of 2.2% or more by weight; when the gate insulating film is formed in the substrate temperature range of 350° to 370° C., the gate electrode may be made of titanium-containing aluminum with a titanium content of 4.2% or more by weight. Here, if it is difficult to accurately control the titanium content of titanium-containing aluminum, it is desirable that the titanium-containing aluminum should have a titanium content of 5% or more even for the silicon-nitride gate insulating film made in the substrate temperature range of 250° to 270° C., in consideration of variations in the titanium content.

It is possible to make silicon nitride films whose film-forming temperature is as low as between 250 and 270° C. almost free from defects and their breakdown voltages sufficiently high by controlling the RF discharging power of the plasma apparatus in the range of 60 to 100 mW/cm$^2$.

For the insulating films of the TFT according to the present invention, in addition to a single-layer silicon nitride film, a multilayer insulating film made from different materials is used in order to further reduce defects and raise the breakdown voltage. In the case of reverse stagger TFTs, formed on the gate electrode of titanium-containing aluminum are the following two layers of gate insulating films: one is a metal oxide film formed by anodization of the gate electrode and the other is a silicon nitride film formed in the temperature range as low as between 250° to 270° C. with the RF discharging power range of 60 to 100 mW/cm$^2$ at the plasma CVD apparatus. Since the anodized film is close in quality, defects are less liable to appear in the two-layer gate insulating film and the breakdown voltage increases. The gate insulating film may be composed of a three-layer structure of a silicon nitride film, a metal oxide film such as a tantalum oxide film, and a silicon nitride film.

With TFTs of this invention, to increase the production efficiency, it is desirable to make the electrode or electrodes on the substrate surface out of aluminum containing a specified amount of titanium and then form a silicon nitride insulating film on the electrode or electrodes in the RF discharging power range of 60 to 100 mW/cm$^2$ at the plasma CVD apparatus. This enables TFTs to be manufactured at a nearly constant temperature through a series of steps, leading to a very high productivity.

TFTs according to the present invention are most suitable for liquid-crystal display devices. A TFT panel using TEFs of this invention comprises: a large number of TFTs arranged in matrix on a transparent insulating substrate; transparent pixel electrodes connected to the source electrodes of the TFTs on a one-to-one basis; scanning signal lines to the gate electrodes of the TFTs on a row or column basis to supply scanning signals to the TFTs; and data signal lines connected to the drain electrode of the TFTs on a row or column basis to supply data signals to the TFTs. A second substrate, on which at least one opposite electrode is formed to face the pixel electrodes, is placed to face the TFT panel a specified distance apart, with liquid crystal being sealed between those substrates. In the TFT panel, at least the electrodes of the TFTs formed on the substrate and the signal lines connected to the electrodes are made of titanium-containing aluminum. In the case of the reverse stagger TFTs, the gate electrodes and scanning signal lines are made of titanium-containing aluminum. Thus, the gate electrodes and scanning signal lines have low resistances, improving the operating characteristics of the TFTs. The decreased resistance of the scanning signal lines prevents the scanning signals from delaying, which results in a clear image on the liquid-crystal display device and a stable operation.

The titanium content of titanium-containing aluminum used for the electrode or electrodes on the substrate is selected, taking into account the relationship between the heating temperature of the substrate in the manufacturing steps for the TFT panel and the allowable wiring resistance of the scanning signal lines and/or data signal lines required for the display size of the liquid-crystal display device. A high heat-treatment temperature of substrates needs more titanium content. However, an increase in the titanium content reduces the resistance, so that the upper limit is set to the range in which the wiring resistance required for the display size lies.

As described above, with this invention, since at least the electrode or electrodes on the substrate are formed out of titanium-containing aluminum, the resistances of the TFT electrodes and signal lines are low, thereby improving the operating characteristics of the TFT elements and panel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of a conventional TFT structure;

FIG. 2 is a sectional view of another conventional TFT structure;

FIG. 3 is a timing chart showing a start timing of process gas supply and a start timing of RF discharge;

FIG. 4 is a schematic view showing an arrangement of a plasma CVD apparatus used in a conventional TFT manufacturing method;

DETAILED DESCRIPTION OF THE PREFERRED EMBODIMENTS

Referring to the accompanying drawings, embodiments of the present invention will be explained.

A FIRST EMBODIMENT

Figure 5:
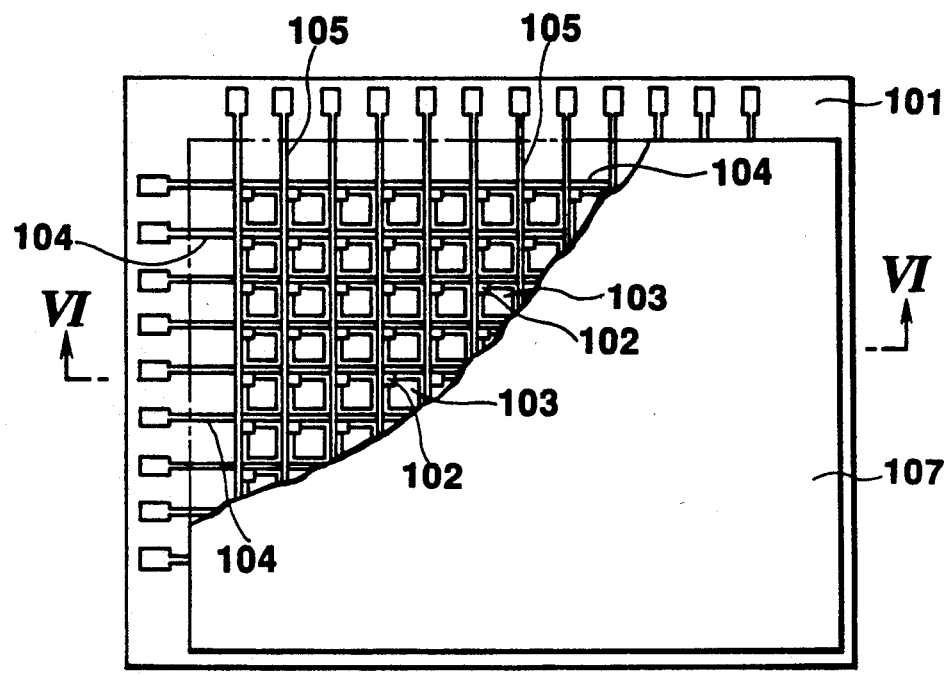
FIG. 5 is a plan view for a TFT liquid-crystal display device using a first embodiment of the present invention.
Figure 6:
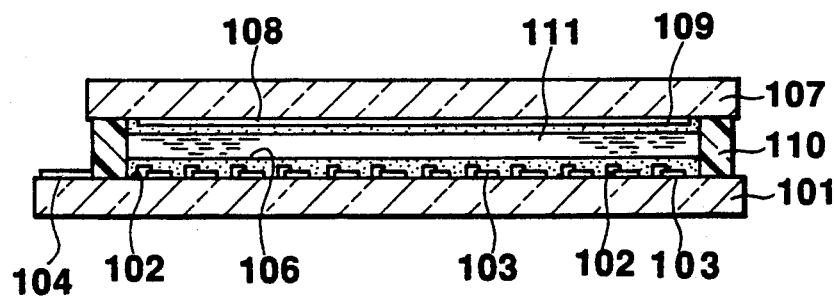
FIG. 6 is a sectional view taken along line VI—VI of FIG. 5.
Figure 7:
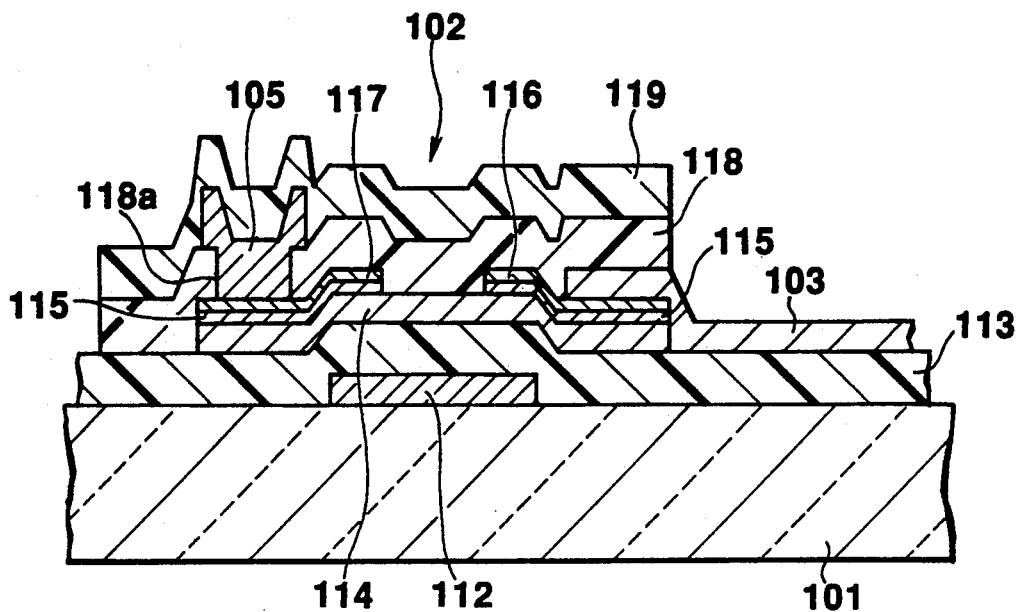
FIG. 7 is an enlarged sectional view for a TFT used in the first embodiment.

FIGS. 5 through 7 show a first embodiment of the present invention. FIG. 5 is a plan view of an active-matrix liquid-crystal display device using TFTs of the present invention. FIG. 6 is a sectional view of the liquid-crystal display device. FIG. 7 is a sectional view of one of the TFTs.

In FIGS. 5 and 6, on a first substrate 101 of a transparent insulating material such as glass, TFTs 102 and transparent pixel electrodes 103 connected to individual TFTs 102 are arranged in matrix. Between the pixel electrodes 103, scanning signal lines 104 run in the row direction to connect to the gate electrodes of the TFTs 102 on a row basis. Also between the pixel electrodes 103, there are data signal lines 105 running in the column direction to connect to the drain electrodes of the TFTs on a column basis. All these components constitute a TFT panel. The pixel electrodes 103, signal lines 104 and 105, and TFTs 102 are covered with an orientation film 106 that is formed all over the first substrate 101. Opposite electrodes 108 facing the pixel electrodes 103 are formed on the surface of a second substrate 107 facing the first substrate a specified distance apart. On the second substrate 107, an orientation film 109 is formed so as to cover the entire surfaces of the opposite electrodes 108. The first and second substrates 101 and 107 are connected to each other a specified distance apart, using a sealing member 110. Between these substrates, a liquid-crystal material 111 is filled.

In FIG. 7, showing a sectional view of one of the TFTs, the thin-film transistor 102 comprises: a gate electrode 112 and a scanning signal line 104 formed on the first substrate 101, a transparent SiN gate insulating film 113 formed on the first substrate 101 so as to cover the gate electrode 112 and scanning signal line 104, an a-Si semiconductor layer 114 formed on the gate insulating film 113 so as to face the gate electrode 112, and source and drain electrodes 116 and 117 formed above both edges of the semiconductor layer 114 via an n$^+$-a-Si (n-type impurity-doped amorphous silicon) ohmic contact layer (hereinafter, referred to as a contact layer) 115. The source electrode 116 is connected to a pixel electrode 103 made of a transparent conducting film such as ITO. The pixel electrode 103 is formed on the gate insulating film 113 so that one end of the electrode 103 may overlap the source electrode 116 for electrical connection. The semiconductor layer 114, source and drain electrodes 116 and 117 are covered with an SiN interlayer insulating film 118 formed over the entire region in which the data signal lines 105 are formed. The data signal line 105 is formed on the interlayer insulating film 118 and connected to the drain electrode 117 through a contact hole 118a formed in the interlayer insulating film 118. The data signal line 105 is covered with an SiN protective insulating film 119.

The gate electrode 112 and scanning signal line 104 are made of titanium-containing aluminum with a titanium content of 2.2% or more by weight. In this embodiment, the data signal line 105 is also made of titanium-containing aluminum with a titanium content of 2.2% or more by weight. The source and drain electrodes 116 and 117 are composed of a metal that has a good ohmic contact with the n$^+$-a-Si contact layer 115, such as Cr.

Referring to Table 2, the manufacturing method of the thin-film transistor will now be described.

TABLE 2

| STEP | Formed Film | Film-forming apparatus | Film Material | Film-forming Temperature |
|---|---|---|---|---|
| step 1 | Gate electrode and wiring | Evaporation or spattering | Ti-containing Al 2.2 wt % or more | 100–200° C. |
| step 2 | Gate insulating film | Plasma CVD | SiN | 250–270° C. |
| step 3 | Semiconductor layer | Plasma CVD | a-Si | About 250° C. |
| step 4 | Contact layer | Plasma CVD | n$^+$-a-Si | About 250° C. |
| step 5 | Source, drain electrodes | Evaporation or spattering | Cr | 100–200° C. |
| step 6 | Pixel electrode | Evaporation or spattering | ITO | 100–200° C. |
| step 7 | Interlayer insulating film | Plasma CVD | SiN | 250–270° C. |
| step 8 | Drain wiring | Evaporation or spattering | Ti-containing Al 2.2 wt % or more | 100–200° C. |
| step 9 | Protective insulating film | Plasma CVD | SiN | 250–270° C. |

STEP 1

First, on the glass substrate 101, a gate metal film is formed out of titanium-containing aluminum with a titanium content of 2.2% or more by weight in the temperature range of 100° to 200° C., using an evaporation or spattering apparatus. The gate metal film is patterned so as to form the gate electrode 112 and scanning signal line 104.

STEP 2

Then, on the substrate 101, an SiN film is formed in the temperature range of 250° to 270° C. with the RF discharging power density range of 60 to 100 mW/cm$^2$, using the plasma CVD apparatus, to produce the gate insulating film 113.

STEP 3

Next, on the gate insulating film (SiN film) 113, an a-Si (amorphous silicon) layer is formed out of hydrogenated a-Si (a-Si:H) as the semiconductor layer 114 at a temperature of about 250° C. in the RF discharge power density range of 40 to 50 mW/cm$^2$, using the plasma CVD apparatus. The reason why the a-Si layer is formed at about 250° C. is that a higher film-forming temperature reduces the hydrogen content in the a-Si layer, degrading the semiconductor characteristics.

STEP 4

Next, on the a-Si layer, an n+-a-Si layer is formed as the contact layer 115 under the same conditions as those for the a-Si layer (a film-forming temperature of about 250° C. in the RF discharging power density range of 40 to 50 mW/cm$^2$), using the plasma CVD apparatus.

STEP 5

Then, on the n+-a-Si layer, a source and drain metal film of, for example, Cr, is formed in the temperature range of 100° to 200° C., using the evaporation or spattering apparatus. After this, the source and drain metal film, and the underlying n+-a-Si layer and a-Si layer are patterned so as to form a semiconductor layer 114 and then the source and drain metal film and n+-a-Si layer are separated into a source and drain electrodes 116 and 117.

STEP 6

Next, a transparent conducting film, such as an ITO film, to serve as the pixel electrode 103, is formed in the temperature range of 100° to 200° C., using the evaporating or spattering apparatus. Then, the ITO film is patterned to produce the pixel electrode 103 one of whose edges overlaps the source electrode 116.

STEP 7

Next, an SiN film is formed as the interlayer insulating film 118 that insulates the scanning signal line 104 from the data signal line 105, under the same conditions as those for the gate insulating film 113 (the film-forming temperature range of 250° to 270° C. with the RF discharging power density range of 60 to 100 mW/cm$^2$, using the plasma apparatus. Following this, the contact hole 118a reaching the drain electrode 117 is made in the interlayer insulating film 118.

STEP 8

Then, on the interlayer insulating film 118, a drain interconnection metal film is formed out of titanium-containing aluminum with a titanium content of 2.2% or more by weight in the temperature range of 100° to 200° C., using the evaporating or spattering apparatus. After this, the drain interconnection metal film is patterned to produce the data signal line 105 connected to the drain electrode 117 at the contact hole 118a.

STEP 9

Next, an SiN film is formed as a protective insulating film 119 in the temperature range of 250° to 270° C. with the RF discharging power density range of 60 to 100 mW/cm$^2$, using the plasma CVD apparatus. This completes the thin-film transistor.

In this thin-film transistor, the gate electrode 112 and scanning signal line 104, which are formed before the formation of the gate insulating film 113, are made of titanium-containing aluminum instead of pure Al. The resistivity of the titanium-containing aluminum is a little higher than that of pure Al, but much lower than those of conventionally used high melting point metals such as Cr, T, or Mo. Therefore, use of the titanium-containing aluminum for the electrodes can improve the operating characteristics of the thin-film transistor.

Further, use of titanium-containing aluminum for the gate electrode 112 and scanning signal line 104 allows less rough film surfaces during film formation and a subsequent heat treatment because of the existence of Ti. Therefore, by selecting the titanium content of the titanium-containing aluminum according to the film-forming temperature of the gate insulating film 113 formed after the formation of the gate electrode 112 and scanning signal line 104, hillocks will not appear in the surfaces of the gate electrode 112 and scanning signal line 104 (titanium-containing aluminum) during the formation of the gate insulating film 113.

Figure 8:
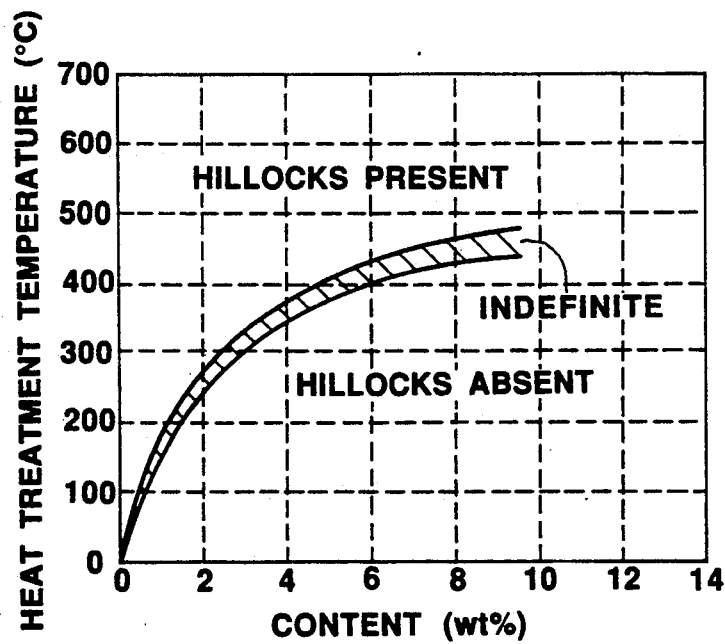
FIG. 8 is a hillock generation chart illustrating hillock-generating regions and no-hillock-generating regions on the chart with the titanium content of titanium-containing aluminum versus heat-treatment temperature.

FIG. 8 shows the relationship between the titanium content of titanium-containing aluminum and heat treatment temperatures at which hillocks take place in the titanium-containing aluminum film. In FIG. 8, for example, for a titanium-containing aluminum with a titanium content of 2.2% by weight, no hillocks appear by heat treatment at 270° C. or lower, but at temperatures higher than that, hillocks appear. For a titanium-containing aluminum with a titanium content of 3.0% by weight, no hillocks appear by heat treatment at 320° C. or lower, but at temperatures higher than that, hillocks appear. Further, for a titanium-containing aluminum with a titanium content of 4.2% by weight, no hillocks appear by heat treatment at 370° C. or lower, but at temperatures higher than that, hillocks appear. In FIG. 8, the shaded portion indicates an indefinite region where it is difficult to determine the presence or absence of hillocks.

As noted above, the presence or absence of hillocks after heat treatment of the titanium-containing aluminum film depends on the titanium content of the titanium-containing aluminum film and the heat treatment temperature (the film-forming temperature for the gate insulating film 113).

Figure 9:
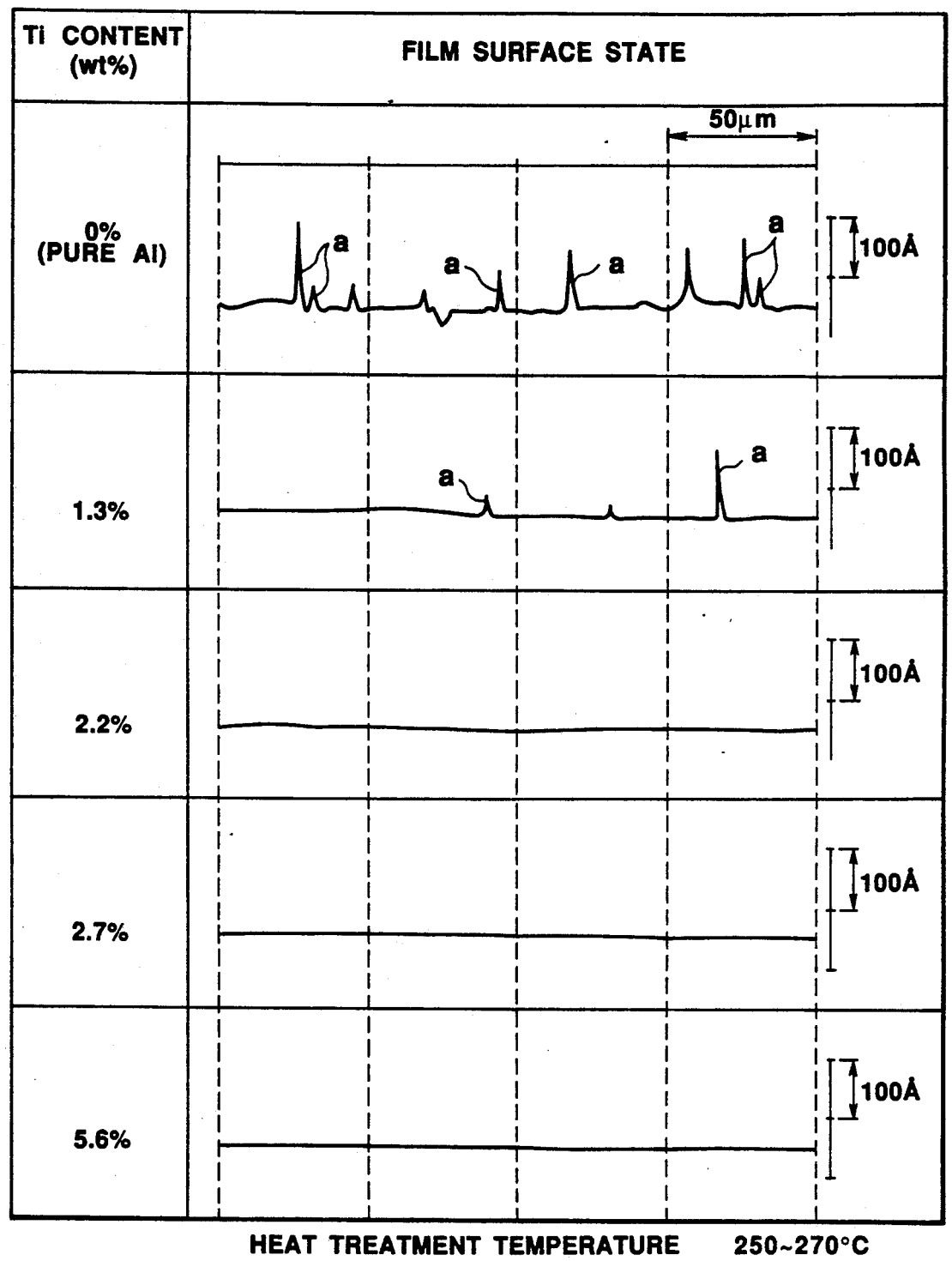
FIG. 9 illustrates hillock generation states at the surface of the titanium-containing aluminum for various titanium contents, when the titanium-containing aluminum is heat-treated at temperatures raging from 250° to 270° C.

FIG. 9 shows how hillocks take place after heat treatment of the titanium-containing aluminum film, when the gate insulating film 113 is formed in the temperature range of 250° to 270° C. as in the above embodiment. What are illustrated here are the results of measuring the film surface states after a pure aluminum film and various titanium-containing aluminum films differing in titanium content have been heat-treated in the 250° to 270° C. range. The heat treatment was done by heating a substrate on which a pure aluminum film or titanium-containing aluminum film has been formed with the plasma CVD apparatus in the same manner as that in the formation of the gate insulating film 113.

As shown in FIG. 9, the pure aluminum film with 0% titanium content had substantially rough film surfaces even after a heat treatment in the 250° to 270° C. range, allowing hillocks $a$ to appear at a high rate. For a titanium-containing aluminum film with a titanium content of 1.3% by weight, the film surface was much less rough than that of the pure aluminum film, but a few hillocks $a$ were observed. In contrast, for a titanium-containing aluminum film with a titanium content of 2.2% by weight, the film surface was almost smooth and no hillocks were observed at all. This holds true for titanium-containing aluminum films with a titanium content of 2.7% and 5.6% by weight. It was found that the more titanium the aluminum film contains, the smoother the film surface becomes.

Since in the embodiment, the gate insulating film 113 is formed in the temperature range of 250° to 270° C. and the gate electrode 112 and scanning signal line 104 are made of titanium-containing aluminum with a titanium content of 2.2% or more by weight, hillocks do not take place at the surfaces of the gate electrode 112 and scanning signal line 104 during formation of the gate insulating film 113. This prevents hillock-caused defects from appearing in the gate insulating film 113. In the embodiment, after the formation of the gate insulating film 113, the semiconductor layer (a-Si layer) 114 and contact layer (n+-a-Si layer) 115 are formed, followed by the formation of the interlayer insulating film 118 and protective insulating film 119 (both made of an SiN film). Since the semiconductor layer 114 and contact layer 115 are formed at about 250° C. and the interlayer insulating film 118 and protective insulating film 119 are formed in the temperature range of 250° to 270° C., the same temperature as that at which the gate insulating film 113 is formed, hillocks do not take place at the surfaces of the gate electrode 112 and scanning signal line 104 at the time of forming those films.

Although not shown in FIG. 9, a titanium-containing

Since in the embodiment, the RF discharging power density is controlled in the range of 60 to 100 mW/cm$^2$ in forming an SiN film to serve as the gate insulating film 113 with the plasma CVD apparatus, the film-forming temperature of as low as about 250° to 270° C. allows the gate insulating film 113 to have a sufficiently high breakdown voltage.

A SECOND EMBODIMENT

When the gate insulating film is made of a stacked film consisting of a plurality of insulating films of different materials, such as a stacked film of an SiN film and a TaO$_x$ (tantalum oxide) film, the gate insulating film may be given a sufficiently high breakdown voltage by forming the gate insulating film in the temperature range as low as 250° to 270° C. with an increased RF discharging power density.

Figure 10:
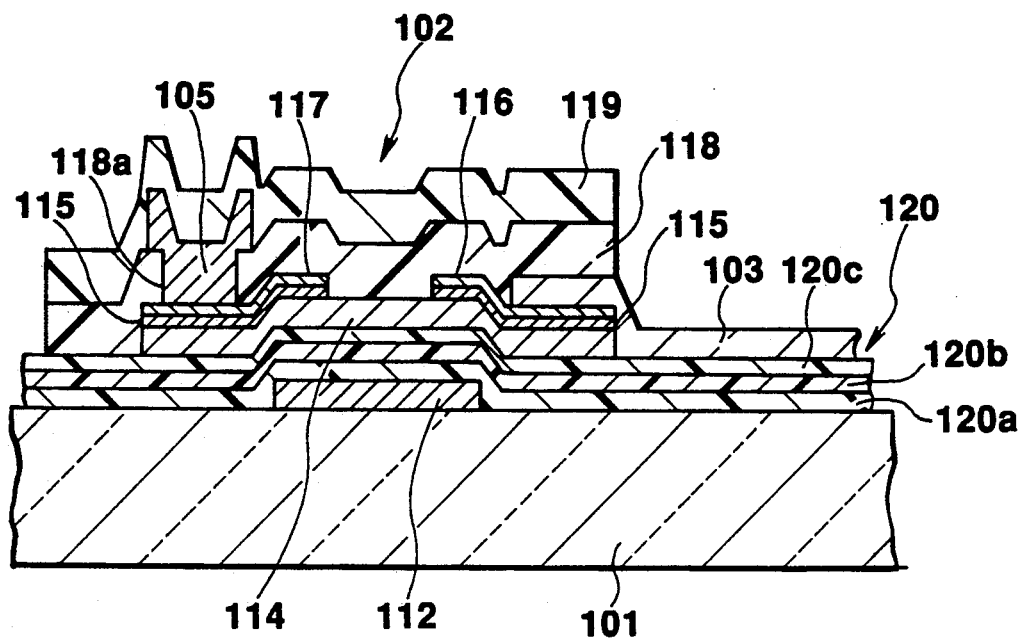
FIG. 10 is an enlarged sectional view for a TFT used in a second embodiment of the present invention.

FIG. 10 and Table 3 are related to a second embodiment of the present invention.

TABLE 3

| STEP | Formed Film | Film-forming apparatus | Film Material | Film-forming Temperature |
|---|---|---|---|---|
| step 1 | Gate electrode and wiring | Evaporation or spattering | Ti-containing Al 2.2 wt % or more | 100–200° C. |
| step 2 | Lower gate insulating film | Plasma CVD | SiN | 250–270° C. |
| step 3 | Middle gate insulating film | spattering | TaO$_x$ | 100–200° C. |
| step 4 | Upper gate insulating film | Plasma CVD | SiN | 250–270° C. |
| step 5 | Semiconductor layer | Plasma CVD | a-Si | About 250° C. |
| step 6 | Contact layer | Plasma CVD | n+-a-Si | About 250° C. |
| step 7 | Source, drain electrodes | Evaporation or spattering | Cr | 100–200° C. |
| step 8 | Pixel electrode | Evaporation or spattering | ITO | 100–200° C. |
| step 9 | Interlayer insulating film | Plasma CVD | SiN | 250–270° C. |
| step 10 | Drain wiring | Evaporation or spattering | Ti-containing Al 2.2 wt % or more | 100–200° C. |
| step 11 | Protective insulating film | Plasma CVD | SiN | 250–270° C. | aluminum film with a titanium content of 2.0% by weight had almost no roughness in the film surface and no hillocks were found at all. For this reason, titanium-containing aluminum films with a titanium content of 2.0% or more by weight are sufficient for heat treatment in the temperature range of 250° to 270° C. In the embodiment, however, for safety's sake, titanium-containing aluminum films with a titanium content of 2.2% or more by weight were used. The titanium-containing aluminum film has a better surface state after heat treatment as its titanium content increases. Since an increase in the titanium content leads to the increase of the resistance of the titanium-containing aluminum film, it is desirable to make the titanium content as little as possible. The film-forming temperature of the gate insulating film 113, interlayer insulating film 118, and protective insulating film 119 may be lower than 250° C. However, the semiconductor layer 114 is formed at about 250° C. to obtain a good semiconductor characteristics and a film quality, so that the gate electrode 112 and scanning signal line 104 are heated to about 250° C. during formation of the semiconductor layer 114, regardless of the insulating films 113 and 118 formed at a film-forming temperature lower than 250° C. Therefore, it is necessary to set the titanium content of the titanium-containing aluminum film for the gate electrode 112 and scanning signal line 104 to a value at which heating to about 250° C. does not cause hillocks. To achieve this, in the embodiment, titanium-containing aluminum films with a titanium content of 2.2% or more by weight were used and the gate insulating film 113, interlayer insulating film 118, and protective insulating film 119 were formed in the temperature range of 250° to 270° C., equal or slightly higher than the film-forming temperature of the semiconductor layer 113.

As shown in FIG. 10, in this embodiment, the gate insulating film 120 is composed of a three-layer film consisting of a lower gate insulating film 120a made of SiN, a middle gate insulating film 120b made of TaO$_x$, and an upper gate insulating film 120c made of SiN. These gate insulating films 120a, 120b, 120c are formed in the temperature range of 250° to 270° C. with the RF discharging power density range of 120 to 130 mW/cm$^2$, using the plasma CVD apparatus. The thin-film transistor of this embodiment has the same arrangement as that of the first embodiment except that the gate insulating film 120 is a three-layer film, so that the same parts as those in the first embodiment are indicated by the same reference characters and their explanations will be omitted. Here, the interlayer insulating film 118 and protective insulating film 119 are formed under the same conditions as those for the gate insulating films 120a, 120b, and 120c (the film-temperature range of 250° to 270° C. with the RF discharging power density range of 120 to 130 mW/cm$^2$). Table 3 lists various conditions concerning the manufacturing method of a thin-film transistor according to the embodiment. The thin film transistor is manufactured in the following steps:

STEP 1

First, on the glass substrate 101, a gate metal film is formed out of titanium-containing aluminum with a titanium content of 2.2% or more by weight in the temperature range of 100° to 200° C., using the evaporation or spattering apparatus. The gate metal film is patterned to form the gate electrode 112 and scanning signal line 104.

STEP 2

Then, on the substrate 101, an SiN film is formed in the temperature range of 250° to 270° C. with the RF discharging power density range of 120 to 130 mW/cm$^2$, using the plasma CVD apparatus, to produce the lower gate insulating film 120a.

STEP 3

Next, on the lower gate insulating film 120a, a TaO$_x$ film is formed in the temperature range of 100° to 200° C., using the spattering apparatus, to produce the middle gate insulating film 120b.

STEP 4

Then, on the middle gate insulating film 120b, an SiN film is formed in the temperature range of 250° to 270° C. with the RF discharging power density range of 120 to 130 mW/cm$^2$, using the plasma CVD apparatus, to produce the upper gate insulating film 120c.

STEP 5

Next, on the gate insulating film (SiN film) 120, an a-Si (amorphous silicon) layer is formed out of hydrogenated a-Si (a-Si:H) as the semiconductor layer 114 at a temperature of about 250° C. with the RF discharge power density range of 40 to 50 mW/cm$^2$, using the plasma CVD apparatus.

STEP 6

Next, on the a-Si layer, an n$^+$-a-Si layer is formed as the contact layer 115 under the same conditions as those for the a-Si layer (a film-forming temperature of about 250° C. in the RF discharging power density range of 40 to 50 mW/cm$^2$), using the plasma CVD apparatus.

STEP 7

Then, on the n$^+$-a-Si layer, a source and drain metal film of, for example, Cr, is formed at a temperature in the range of 100° to 200° C., using the evaporation or spattering device. After this, the source and drain metal film and the underlying n$^+$-a-Si layer and a-Si layer are patterned so as to form a semiconductor layer 114 and then the source and drain metal film and n$^+$-a-Si layer are separated into a source and drain electrodes 116 and 117.

STEP 8

Next, a transparent conductive film, such as an ITO film, to serve as the pixel electrode 103, is formed at the temperature in the range of 100° to 200° C., using the evaporating or spattering apparatus. Then, the ITO film is patterned to produce the pixel electrode 103 one of whose edges overlaps the source electrode 116.

STEP 9

Next, an SiN film is formed as the interlayer insulating film 118 that insulates the scanning signal line 105 from the data signal line 104 under the same conditions as those for the gate insulating films 120a and 120c (the film-forming temperature range of 250° to 270° C. with the RF discharging power density range of 120 to 130 mW/cm$^2$), using the plasma CVD apparatus. Following this, the contact hole 117a reaching the drain electrode 117 is made in the interlayer insulating film 118.

STEP 10

Then, on the interlayer insulating film 118, a drain interconnection metal film, is formed out of titanium-containing aluminum with a titanium content of 2.2% or more by weight at the temperature in the range of 100° to 200° C., using the evaporating or spattering apparatus. After this, the drain interconnection metal film is patterned to produce the data signal line 105 connected to the drain electrode 117 through contact hole 118a.

STEP 11

Next, an SiN film is formed as the protective insulating film 119 in the temperature ranging of 250° to 270° C. with the RF discharging power density range of 120 to 130 mW/cm$^2$, using the plasma CVD apparatus. This completes the thin-film transistor 102.

Since in the embodiment, the gate insulating films 120a and 120c, interlayer insulating film 118, and protective insulating film 119 are formed in the temperature ranging of 250° to 270° C., the gate electrode 112 and scanning signal line 104 may be made of titanium-containing aluminum with a titanium content of 2.2% or more by weight. In the embodiment, the gate insulating film 120 is composed of a three-layer film consisting of a lower SiN gate insulating film 120a, middle TaO$_x$ gate insulating film 120b, and upper SiN gate insulating film 120c, the middle gate insulating film 120b being a close insulating film made of a highly insulating metal oxide. Therefore, even if the upper and lower gate insulating films 120a, 120c are films with low breakdown voltages which have been made in the temperature ranging of 250° to 270° C. with the RF discharging power density range of 120 to 130 mW/cm$^2$, the total breakdown voltage of the three-layer film composed of the gate insulating films 120a, 120b, and 120c is sufficiently high.

A THIRD EMBODIMENT

While in the first and second embodiments, the gate insulating film 112 or 120, interlayer insulating film 118, and protective insulating film 119 are formed in the temperature range of 250° to 270° C., they may be formed in the higher temperature range of 350° to 370° C.

Table 4 lists various conditions concerning the manufacturing steps for a third embodiment of the present invention. In this embodiment, the gate insulating film is formed in the temperature range of 350° to 370° C.

TABLE 4

| STEP | Formed Film | Film-forming apparatus | Film Material | Film-forming Temperature |
|---|---|---|---|---|
| step 1 | Gate electrode and wiring | Evaporation or spattering | Ti-containing Al 2.2 wt % or more | 100–200° C. |
| step 2 | Gate insulating film | Plasma CVD | SiN | 350–370° C. |
| step 3 | Semiconductor layer | Plasma CVD | a-Si | About 250° C. |
| step 4 | Contact layer | Plasma CVD | n$^+$-a-Si | About 250° C. |
| step 5 | Source, drain electrodes | Evaporation or spattering | Cr | 100–200° C. |
| step 6 | Pixel electrode | Evaporation or spattering | ITO | 100–200° C. |
| step 7 | Interlayer insulating film | Plasma CVD | SiN | 350–370° C. |
| step 8 | Drain wiring | Evaporation or spattering | Ti-containing Al 4.2 wt % or more | 100–200° C. |

TABLE 4-continued

| STEP | Formed Film | Film-forming apparatus | Film Material | Film-forming Temperature |
|---|---|---|---|---|
| step 9 | Protective insulating film | Plasma CVD | SiN | 350-370° C. |

The thin-film transistor of this embodiment has the same arrangement as that of the first embodiment of FIG. 7, so that its explanation will be omitted. When the gate insulating film is formed at a high temperature in the range of 350° to 370° C. as in this embodiment, the gate electrode and gate interconnections may be made of titanium-containing aluminum with a titanium conthen the source and drain metal film and n+-a-Si layer are separated into source and drain electrodes 116 and 117.

STEP 6

Next, a transparent conducting film, such as an ITO film, to serve as the pixel electrode 103, is formed in

TABLE 1

| STEP | Formed Film | Film-forming apparatus | Film Material | Film-forming Temperature |
|---|---|---|---|---|
| step 1 | Gate electrode and wiring | Evaporation or spattering | Cr or Ta or Mo | 100-200° C. |
| step 2 | Gate insulating film | Plasma CVD | SiN | About 350° C. |
| step 3 | Semiconductor layer | Plasma CVD | a-Si | About 250° C. |
| step 4 | Contact layer | Plasma CVD | n+-a-Si | About 250° C. |
| step 5 | Source, drain electrodes | Evaporation or spattering | Cr | 100-200° C. |
| step 6 | Pixel electrode | Evaporation or spattering | ITO | 100-200° C. |
| step 7 | Interlayer insulating film | Plasma CVD | SiN | About 350° C. |
| step 8 | Drain wiring | Evaporation or spattering | Al on Ti | 100-200° C. |
| step 9 | Protective insulating film | Plasma CVD | SiN | About 350° C. | tent of 4.2% or more by weight (refer to FIG. 8).

The thin-film transistor is manufactured, following the steps described below. The same films as those in FIG. 7 are indicated by the same reference characters.

STEP 1

First, on the glass substrate 101, a gate metal film is formed out of titanium-containing aluminum with a titanium content of 4.2% or more by weight in the temperature range of 100° to 200° C., using the evaporation or spattering apparatus. The gate metal film is patterned to form the gate electrode 112 and scanning signal line 104.

STEP 2

Then, on the substrate 101, an SiN film is formed in the temperature range of 350° to 370° C. with the RF discharging power density range of 120 to 130 mW/cm$^2$, using the plasma CVD apparatus, to produce the gate insulating film 113. The gate insulating film 113 is close in quality and its breakdown voltage is sufficiently high because it is formed in the high temperature range of 350° to 370° C.

STEP 3

Next, on the gate insulating film (SiN film) 113, an a-Si (amorphous silicon) layer is formed out of hydrogenated a-Si (a-Si:H) as the semiconductor layer 114 at a temperature of about 250° C. in the RF discharge power density range of 40 to 50 mW/cm$^2$, using the plasma CVD apparatus.

STEP 4

Next, on the a-Si layer, an n+-a-Si layer is formed as the contact layer 115 under the same conditions as those for the a-Si layer (a film-forming temperature of about 250° C. in the RF discharging power density range of 40 to 50 mW/cm$^2$), using the plasma CVD apparatus.

STEP 5

Then, on the n+-a-Si layer, a source and drain metal film of, for example, Cr, is formed in the temperature range of 100° to 200° C., using the evaporation or spattering device. After this, the source and drain metal film, and the underlying n+-a-Si layer and a-Si layer are patterned so as to form a semiconductor layer 114 and the temperature range of 100° to 200° C., using the evaporating or spattering apparatus. Then, the ITO film is patterned to produce the pixel electrode 103 one of whose edges overlaps the source electrode 116.

STEP 7

Next, an SiN film is formed as the interlayer insulating film 118 that insulates the scanning signal line 104 from the data signal line 105, under the same conditions as those for the gate insulating film 113 (the film-forming temperature range of 350° to 370° C. with the RF discharging power density range of 120 to 130 mW/cm$^2$), using the plasma CVD apparatus to produce. Following this, the contact hole 118a reaching the drain electrode 117 is made in the interlayer insulating film 118.

STEP 8

Then, on the interlayer insulating film 118, a drain interconnection metal film is formed out of titanium-containing aluminum with a titanium content of 4.2% or more by weight, in the temperature range of 100° to 200° C., using the evaporating or spattering apparatus. After this, the drain interconnection metal film is patterned to produce the data signal line 105 connected to the drain electrode 117 through the contact hole 118a.

STEP 9

Next, an SiN film is formed as a protective insulating film 119 in the temperature range of 350° to 370° C. with the RF discharging power density range of 120 to 130 mW/cm$^2$, using the plasma CVD apparatus. This completes the thin-film transistor 102.

With this embodiment, since the gate electrode 112 and scanning signal line 104, which have been formed before the formation of the gate insulating film 113, have been made of titanium-containing aluminum instead of pure aluminum, the operating characteristics of the thin-film transistor can be improved. Further in the embodiment, the gate electrode 112 and scanning signal line 104 are made of titanium-containing aluminum with a titanium content of 4.2% or more by weight, so that hillocks do not appear at the surfaces of the gate electrode 112 and scanning signal line 104.

Figure 11:
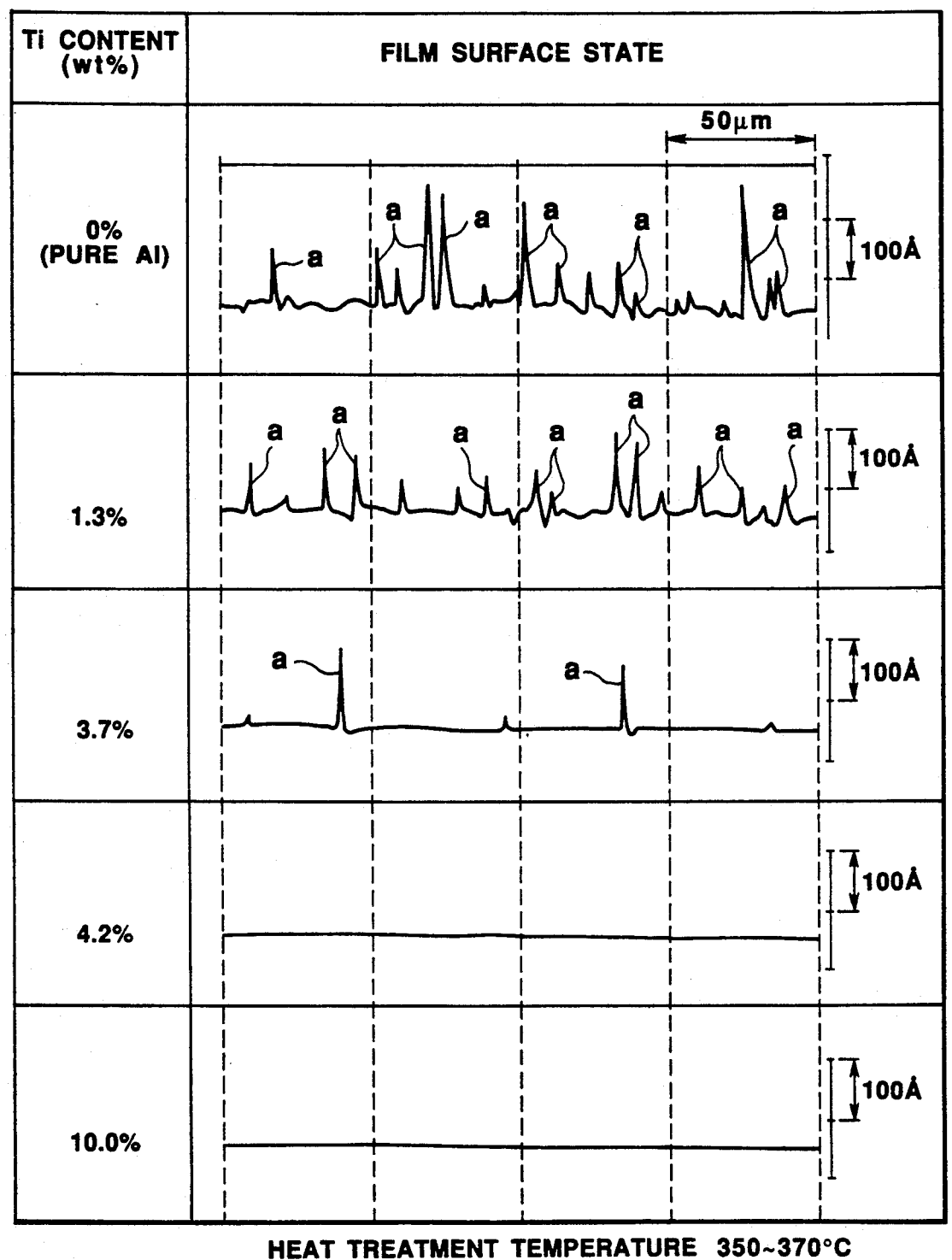
FIG. 11 illustrates hillock generation states at the surface of the titanium-containing aluminum for various titanium contents, when the titanium-containing aluminum is heat-treated at temperatures raging from 350° to 370° C.

FIG. 11 shows the results of measuring the film surfaces after a pure aluminum film and various titanium-aluminum films differing in titanium content have been heat-treated at temperatures ranging from 350° to 370° C. The heat treatment was done by heating a substrate on which a pure aluminum film or titanium-containing aluminum film has been formed with the plasma CVD apparatus in the same manner as that in the formation of the gate insulating film 113.

As shown in FIG. 11, the pure aluminum film with 0% aluminum content had extremely rough film surfaces after a heat treatment in the 350° to 370° C. range, allowing hillocks $a$ to appear at a significantly high rate. This holds essentially true for a titanium-containing aluminum film with a titanium content of 1.3% by weight, leading to the creation of hillocks at a high rate. For a titanium-containing aluminum film with a titanium content of 3.7% by weight, the film surface was much less rough than that of the pure aluminum film, but a few hillocks $a$ were observed. In contrast, for a titanium-containing aluminum film with a titanium content of 4.2% by weight, the film surface was almost smooth and no hillock was observed at all. This holds true for titanium-containing aluminum films with a titanium content of 10.0% by weight. It was found that the more titanium the aluminum film contains, the smoother the film surface becomes.

With the embodiment, hillocks do not take place at the surfaces of the gate electrode 112 and scanning signal line 104 during formation of the gate insulating film 113. This prevents hillock-caused defects from appearing in the gate insulating film 113. In the embodiment, after the formation of the gate insulating film 113, the semiconductor layer (a-Si layer) 114 and contact layer (n+-a-Si layer) 115 are formed, followed by the formation of the interlayer insulating film 118 and protective insulating film 119 (both made of an SiN film). Since the semiconductor layer 114 and contact layer 115 are formed at about 250° C. and the interlayer insulating film 118 and protective insulating film 119 are formed in the temperature range of 350° to 370° C., the same temperature as that at which the gate insulating film 113 is formed, hillocks do not take place at the surfaces of the gate electrode 112 and scanning signal line 104 at the time of forming those films.

Although not shown in FIG. 11, a titanium-containing aluminum film with a titanium content of 4.0% by weight had almost no roughness in the film surface and any hillocks were not found at all. For this reason, titanium-containing aluminum films with a titanium content of 4.0% or more by weight are sufficient for heat treatment in the temperature range of 350° to 370° C. In the embodiment, however, for safety's sake, titanium-containing aluminum films with a titanium content of 4.2% or more by weight were used.

Although in the first through third embodiments, the data signal line 105 is made of titanium-containing aluminum, it may be made of a high melting-point metal such as Cr, the same metal as that making up the source and drain electrodes 116 and 118. In this case, the source and drain electrodes 116 and 118 and data signal line 105 may be formed by patterning the same metal film in a manner similar to that in the formation of the gate electrode 112 and scanning signal line 104. Further, the source and drain electrodes 116 and 117 may be made of a titanium-containing aluminum film whose titanium content is set in response to the film-forming temperature for the gate insulating film 113 or the like.

In this case, it is desirable that the source and drain electrodes 116 and 117 should be two-layer films that have a metal thin film, such as a Cr film, with a good ohmic contact at the interface with the contact layer (n+-a-Si layer) 115. The metal film made of such as Cr may be extremely thin. Use of the two-layer film of a titanium-containing aluminum and a metal thin film made of such as Cr results in a very small increase in the resistance.

While in the embodiment, the present invention is applied to the reverse stagger type, it may be applicable to the reverse coplanar type, the stagger type, and the coplanar type. In this case, of the gate electrode and the source and drain electrodes, at least the lower electrode (the gate electrode for the reverse coplanar type, and the source and drain electrodes for the stagger and coplanar types) formed before the formation of the gate insulating film must be made of titanium-containing aluminum.

The above-mentioned titanium-containing aluminum thin film is formed by means of the spattering apparatus using a target of titanium-containing aluminum or a target of a pure aluminum to which fine titanium chips have been dispersed. The titanium-containing aluminum target may be made by mixing powdered titanium with aluminum, melting the mixture, and repeating rolling and forging so that the titanium may not be segregated during cooling. The titanium mixing ratio can be set to a desired value by controlling the mixing level for the titanium-containing aluminum target, and by controlling the ratio of the titanium chip exposure area to the aluminum exposure area for the fine titanium chip-dispersed target.

The titanium content of the titanium-containing aluminum gate electrode 112 and scanning signal line 104 is selected, depending on the relationship between the heating temperature of the substrate in the manufacturing steps for the TFT panel and the allowable wiring resistance of the scanning signal line and/or data signal line required for the size of the liquid-crystal display device. The titanium content is increased with the heat treatment temperature of the substrate. An higher titanium content reduces the resistance, so that the upper limit is set to the wiring resistance range that includes a value required for the display size. For example, since titanium-containing aluminum with a titanium content of 5% by weight has a resistivity of about 17 $\mu\Omega$·cm, a 20-inch liquid crystal device is possible for the number of dots 640×3 horizontal, 480 vertical, and up to about 13-inch liquid-crystal devices are possible for the number of dots 1120×3 horizontal, 780 vertical.

A FOURTH EMBODIMENT

Figure 12:
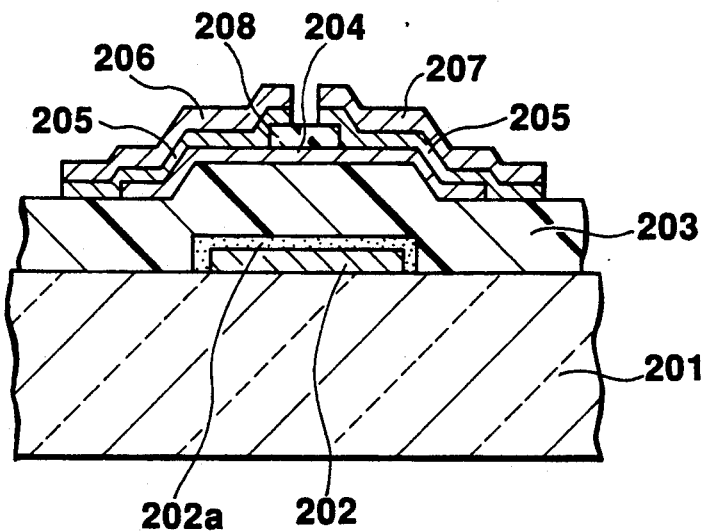
FIG. 12 is an enlarged sectional view for a TFT used in a fourth embodiment of the present invention.

The present invention may be applied to a TFT having two-layer gate insulating film. FIG. 12 is a sectional view for a fourth embodiment of the present invention. FIGS. 13A through 13F are sectional views illustrating the manufacturing sequence of the fourth embodiment.

In FIG. 12, the fourth embodiment comprises a gate electrode 202 formed on a glass substrate 201, an SiN gate insulating film 203 on the gate electrode 202, an a-Si i type semiconductor layer 204 formed on the gate insulating film 203 so as to face the gate electrode 202, and a source and drain electrodes 206 and 207 formed on both edges of the i-type semiconductor layer 204 via an n-type impurity-doped a-Si n-type semiconductor layer 205. Above the channel region of the i-type semiconductor layer 204, an SiN blocking insulating film 208 is formed.

The gate electrode 202 is made of titanium-containing aluminum, and the surface layer of the gate electrode 202 is an anodized layer 202a.

The source and drain electrodes 206 and 207 are made of, for example, Cr that has a good contact with the n-type semiconductor layer 205, or are two-layer electrodes consisting of a low-resistance conductive film such as an aluminum film on a Cr film or the like.

FIGS. 13A through 13F show the manufacturing method of the thin-film transistor. The thin-film transistor is manufactured following the steps described below.

STEP 1

Figure 13A:
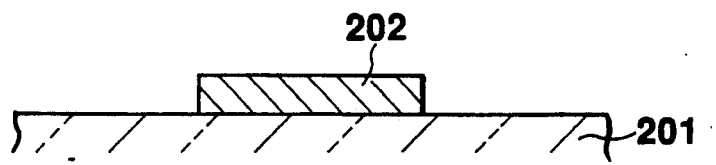
FIGS. 13A through 13F are sectional views illustrating the manufacturing sequence of the fourth embodiment of FIG. 12.

As shown in FIG. 13A, on the glass substrate 201, the titanium-containing aluminum gate electrode 202 is formed by first forming a titanium-containing aluminum film on the glass substrate 201 with the spattering apparatus and then performing photoetching on the titanium-containing aluminum film to produce the desired pattern.

The titanium content of the titanium-containing aluminum film is selected depending on the film-forming temperature of the gate insulating film 203 formed after the formation of the gate electrode 202.

STEP 2

Figure 13B:
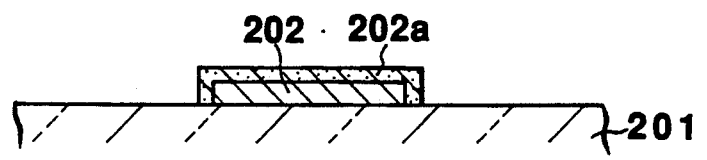

Next, as shown in FIG. 13B, the surface layer of the gate electrode 202 is anodized to turn the surface layer into an anodized layer 202a.

The anodization of the gate electrode 202 is performed by immersing the glass substrate 201 on which the gate electrode 202 has been formed in an electrolyte so that the gate electrode 202 may face the cathode and then applying an voltage across the gate electrode 202 and cathode.

STEP 3

Figure 13C:
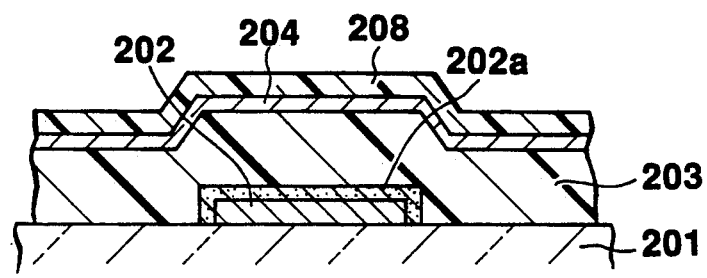

Then, as shown in FIG. 13C, the gate insulating film 203, i-type semiconductor layer 204, and blocking insulating film 208 are formed in sequence, using the plasma CVD apparatus.

The gate insulating film (SiN film) 203 is formed, for example, at the temperature of 350° to 370° C. with the RF discharging power density range of 120 to 130 mW/cm$^2$. The SiN film 203 thus formed under such conditions has a close quality and a high breakdown voltage.

The i-type semiconductor layer (a-Si layer) 204 is formed out of hydrogenated a-Si (a-Si:H) at about 250° C. with the RF discharging power density range of 40 to 50 mW/cm$^2$. The reason why the i-type semiconductor layer 204 is formed at about 250° C. is that a higher film-forming temperature reduces the hydrogen content of the semiconductor layer 204, impairing the semiconductor characteristics.

The blocking insulating film (SiN film) 208 is formed under the same conditions as those for the gate insulating film 203.

STEP 4

Figure 13D:
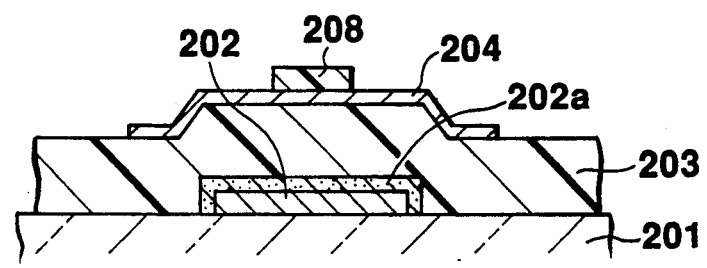

Then, as shown in FIG. 13D, the blocking insulating film 208 except for the portion corresponding to the channel region of the i-type semiconductor layer 204 is removed by photoetching, and then the i-type semiconductor layer 204 is shaped into a specified pattern by further photoetching.

STEP 5

Figure 13E:
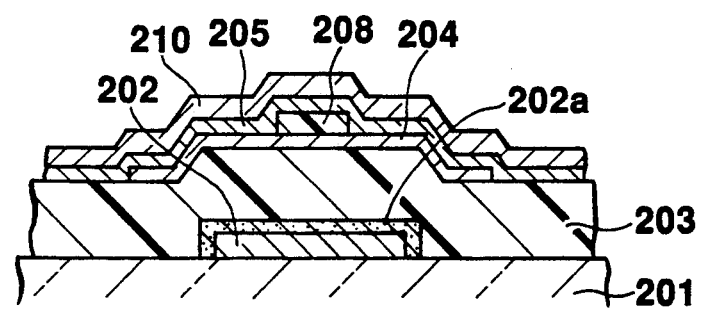

Next, as shown in FIG. 13E, the n-type semiconductor layer 205 is formed under the same conditions as those for the i-type semiconductor layer 204, using the plasma CVD apparatus. On the layer 205, a metal film 210 for source and drain electrodes (such as a Cr film or a two-layer film of Cr and Al films) is formed in the temperature range of 100° to 200° C., using the spattering apparatus.

STEP 6

Figure 13F:
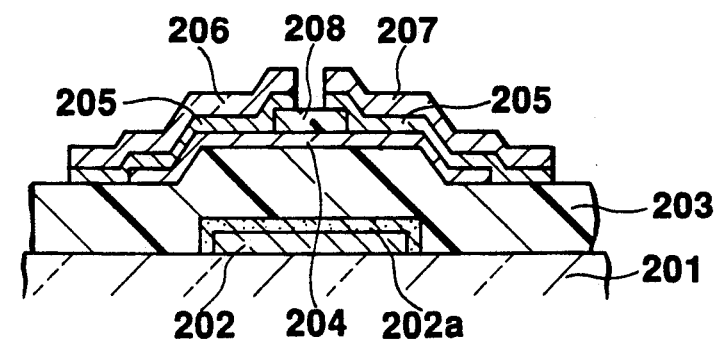

Next, as shown in FIG. 13F, the metal film 210 for source and drain electrodes is patterned by photoetching to form source and drain electrodes 206 and 207. After this, the n-type semiconductor layer 205 except for the portions under the source and drain electrodes 206 and 207 is etched away to complete the thin-film transistor shown in FIG. 12.

In the thin-film transistor of the embodiment, the gate electrode 202 formed on the glass substrate 201 is made of titanium-containing aluminum (Ti-containing Al) instead of pure aluminum with its surface being anodized.

Although the titanium-containing aluminum has a little larger resistivity than that of pure aluminum, its resistivity is lower than that of high melting-point metals such as titanium or a titanium-molybdenum alloy used for the gate electrodes of conventional thin-film transistors, and its adhesive properties with the glass substrate are good.

Since the thin-film transistor has the gate electrode 202 made of low-resistance titanium-containing aluminum, a voltage drop across the gate electrode is small, thereby improving the operating characteristics.

The titanium-containing aluminum film, compared with a pure Al film with no titanium, has a less rough film surface after heat treatment. Anodization of the surface layer makes the heat-treatment-caused roughness in the film surface even smoother.

Formation of the gate electrode 202 out of titanium-containing aluminum and anodization of its surface layer create almost no roughness in the surface of the gate electrode 202 during the formation of the gate insulating film 203 after the formation of the gate electrode 202. Thus, the gate insulating film 203 does not have defects caused by the roughness in the surface of the gate electrode 202. Since the insulating film on the gate electrode 202 is a two-layer film composed of the anodized layer 202a at the gate electrode surface and the gate insulating film 203, with the metal oxide film and silicon nitride film acting as the gate insulating film, the breakdown voltage between the gate electrode 202 and the source and drain electrodes 206 and 207 is sufficiently high.

The titanium content of the titanium-containing aluminum may be selected depending on the film-forming temperature for the gate insulating film 203 to be formed after the formation of the gate electrode 202. When the gate insulating film 203 is formed in the temperature range of 350° to 370° C. as in the embodiment, the gate electrode 202 may be made of titanium-containing aluminum with a titanium content of 4.2% or more by weight.

The more titanium the titanium-containing aluminum contains, the better the surface condition after heat treatment becomes. The increase of titanium content results in an increase in the resistance of the titanium-containing aluminum, so that it is desirable to form the gate electrode out of titanium-containing aluminum with titanium as less as possible unless the content drops below 4.2% by weight.

The gate electrode 202 is heated to particular film-forming temperatures each time the i-type semiconductor layer 204 to be formed after the formation of the gate insulating film 203, the blocking insulating film 208, the n-type semiconductor layer 205, and the source and drain electrode film 210 are formed. Those film-forming temperatures are equal to or lower than that for the gate insulating film 203: about 250° C. for the i-type semiconductor layer 204 and n-type semiconductor layer 205, 350° to 370° C. for the blocking insulating film 208, and 100° to 200° C. for the source and drain electrode film 210. As a result of this, during the formation of those films, roughness will not appear in the surface of the gate electrode 202.

The titanium-containing aluminum gate electrode 202 has a good adhesive properties with the glass substrate 201, which makes it unnecessary to provide an underlying film that enables the gate electrode to be in good contact with the glass substrate surface as in conventional thin-film transistors. Because titanium-containing aluminum is not expensive, the gate electrode can be made at low cost.

With the thin-film transistor of the embodiment, it is possible to improve the operating characteristics and sufficiently raise the breakdown voltage between the gate electrode 202 and the source and drain electrodes 206 and 207 by decreasing a voltage drop across the gate electrode 202. It is also possible to reduce the production cost by forming the gate electrode 202 at low cost.

While in the embodiment, the gate insulating film 203 is formed in the temperature range of 350° to 370° C., it may be formed at a lower temperature. Forming the gate insulating film 203 and blocking insulating film 208 at the same lower temperature allows the gate electrode 202 to be made of titanium-containing aluminum with a titanium content less than that of the embodiment, thereby reducing the resistance.

The gate insulating film (SiN film) 203 with a sufficiently high breakdown voltage may be formed slowly in the lower temperature range of, for example, about 250° to 270° C., with the RF discharging density range of 60 to 100 mW/cm$^2$, using the plasma CVD apparatus.

When the gate insulating film 203 and blocking insulating film 208 are formed in the temperature range of about 250° to 270° C., the titanium content of titanium-containing aluminum used for the gate electrode 202 may be 2.2% or more by weight. Formation of the gate electrode 202 out of titanium-containing aluminum with a titanium content of 2.2% or more by weight introduces almost no roughness to the surface of the gate electrode 202 during the formation of the gate insulating film 203 and blocking insulating film 208.

The gate insulating film 203 and blocking insulating film 208 may be formed at an even lower temperature. Since the gate electrode is heated to about 250° C. each time the i-type semiconductor layer 204 and n-type semiconductor layer 205 are formed, it is desirable to form the gate electrode 202 out of titanium-containing aluminum with a titanium content of 2.2% or more by weight even when the gate insulating film 203 and blocking insulating film 208 are formed at an even lower temperature.

While in the embodiment, the present invention is applied to the thin-film transistor of the reverse stagger type, it may be applied to the thin-film transistor of the reverse coplanar type in which the i-type semiconductor layer 204 and the source and drain electrodes 206 and 207 are stacked in the opposite order to that in the embodiment.

The forming method of silicon-based thin films used for the aforementioned TFTs will now be explained.

FIRST FILM FORMING METHOD

Figure 14:
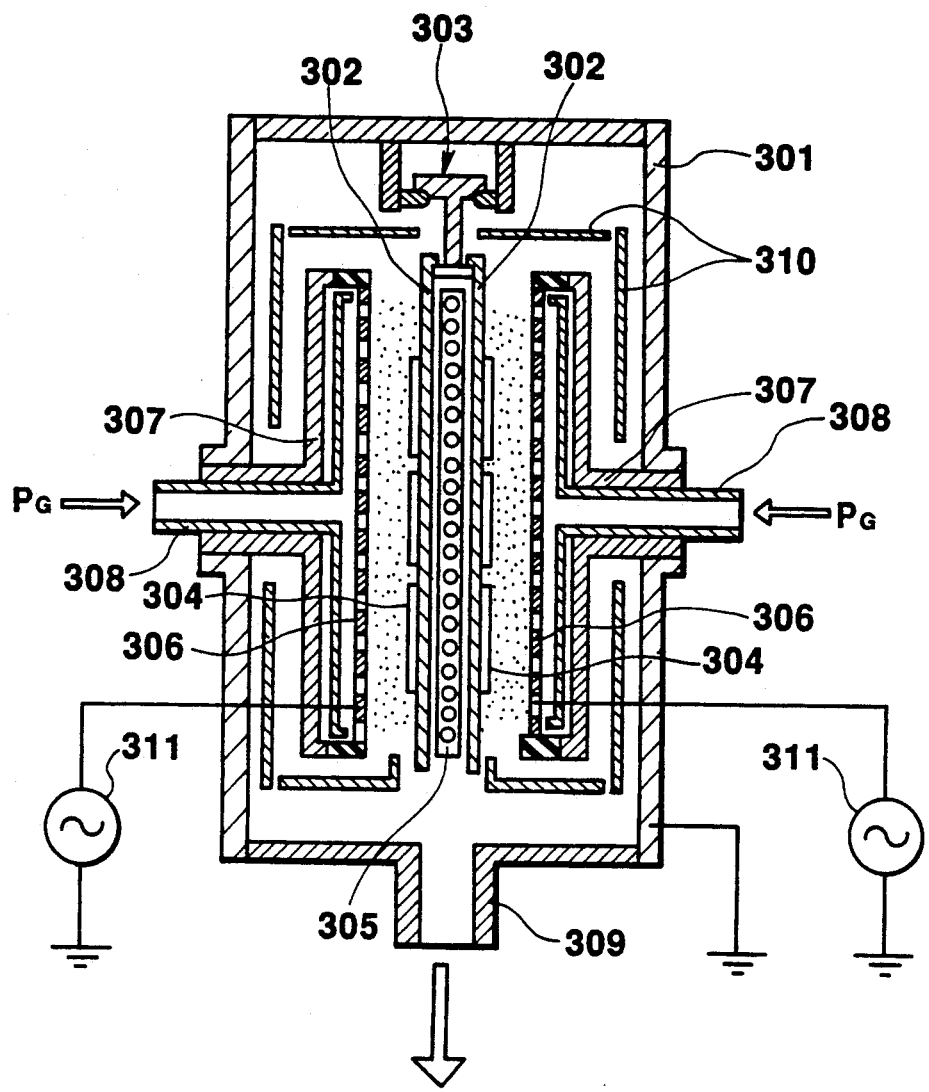
FIG. 14 is a sectional view showing a schematic arrangement of a plasma CVD apparatus used in the present invention.

A silicon-based thin film according to the present invention is formed by using a plasma CVD apparatus shown in FIG. 14. This plasma CVD apparatus employs a vertical both-side discharge scheme.

Referring to FIG. 14, a substrate holder 302 is movably supported by a holder moving mechanism 303 inside a hermetic chamber 301. A plurality of substrates 304 subjected to formation of silicon-based thin films are mounted on both major surfaces of the substrate holder 302. A heater 305 is arranged inside the substrate holder 302 to maintain the substrates 304 to a predetermined temperature. RF electrodes 306 are arranged to respectively oppose the substrates 304 mounted on both the major surfaces of the substrate holder 302. The RF electrodes 306 are mounted in the chamber 301 to be electrically insulated from each other by electrode support members 307. Each RF electrode 306 comprises a metal plate having a large number of holes through which process gas PG flows toward the substrates 304. An inlet port 308 for receiving the process gas $P_G$ is formed in the rear surface of each RF electrode 306, so that the process gas PG is supplied from the inlet port 308 to the chamber. The gas in the chamber is discharged through a discharge port 309 by a vacuum pump (not shown) connected to the discharge port 309. Attachment protective plates 310 for prevention attachment of the silicon-based material on the inner wall surface of the chamber are arranged outside the area in which the substrates 304 and the RF electrodes 306 are disposed. High-frequency power sources 311 is connected to the RF electrodes 306. Other members such as the chamber 301 and the substrate holder 302 except for the RF electrodes 306 are grounded.

In order to form a silicon-based thin film by using this plasma CVD apparatus, the substrates 304 are mounted on the substrate holder 302 and are heated to about 230° C. to 270° C. The substrate holder 302 which holds the heated substrates 304 is mounted on the holder moving mechanism 303 and is set in the chamber at a predetermined position. A door of the chamber is closed, and the chamber is evacuated to a vacuum of about 10$^{-7}$ Torr by a vacuum pump, and the process gas as a gas mixture of a main reaction gas and a carrier gas is supplied from the inlet ports 308. The supply amount of carrier gas and the amount of carrier gas discharged from the discharge port 309 are controlled so that the internal pressure of the chamber is stabilized to be about 0.5 Torr. The substrates 304 are heated by the heater 305 so as not to reduce the substrate temperature, so that the substrate temperature is kept almost constant. After the substrate temperature and the internal pressure of the chamber are stabilized, a high-frequency current is supplied from the high-frequency power source 111 to the RF electrodes 306 to start an electrical glow discharge between the RF electrodes 306 and the substrate holder 302 and to generate a plasma between the RF electrodes 306 and the substrate holder. The process gas is decomposed in this plasma state. A chemical reaction occurs to deposit a thin film of a predetermined material on each substrate 304. This film is grown to obtain a desired silicon-based thin film.

According to the first method of forming a thin-film, film formation is performed in the substrate temperature range of 230° C. to 270° C. and the RF discharge power density range of 60 to 100 mW/cm$^2$. An appropriate process gas is selected in accordance with the type of film to be formed and is supplied in a appropriate amount. When a silicon-based thin film to be formed consists of silicon nitride, monosiline gas or disilane gas and ammonia gas are used to constitute a main reaction gas, and nitrogen, hydrogen, helium, or a gas mixture thereof is used as a carrier gas. For example, when SiH$_4$ and NH$_4$ are used to constitute a main reaction gas, and N$_2$ is used as a carrier gas, they are preferably mixed at a ratio of 1:1:14 to 1:2.7:12.3. A silicon nitride thin film thus manufactured has a composition ratio (Si/N) of 0.75 to 0.85 as a ratio of the number of silicon atoms (Si) to the number of nitrogen atoms (N).

A silicon nitride film was formed under the following conditions falling within the range of the above film formation conditions:

| Substrate Temperature: | | 250° C. |
|---|---|---|
| Main Reaction Gas: | SiH$_4$ | 30 cc/M |
| | NH$_3$ | 60 cc/M |
| Carrier Gas: | N$_2$ | 390 cc/M |
| Pressure: | | 0.5 Torr |
| RF Discharge Frequency: | | 13.56 MHz |
| Discharge Power Density: | | 84 mW/cm$^2$ |

The discharge power density is a value obtained by dividing a supplied high-frequency power by the area of each RF electrode. The unit cc/M represents an amount (cc) of 1-atm. 0° C. gas which flows per minute.

The silicon nitride film formed under the above conditions has a very small number of defects and sufficiently high breakdown voltages since the RF discharge power density is as low as 84 mW/cm$^2$ although the film formation temperature is as low as 250° C. A composition ratio of this silicon nitride film is about 0.85.

Figure 15:
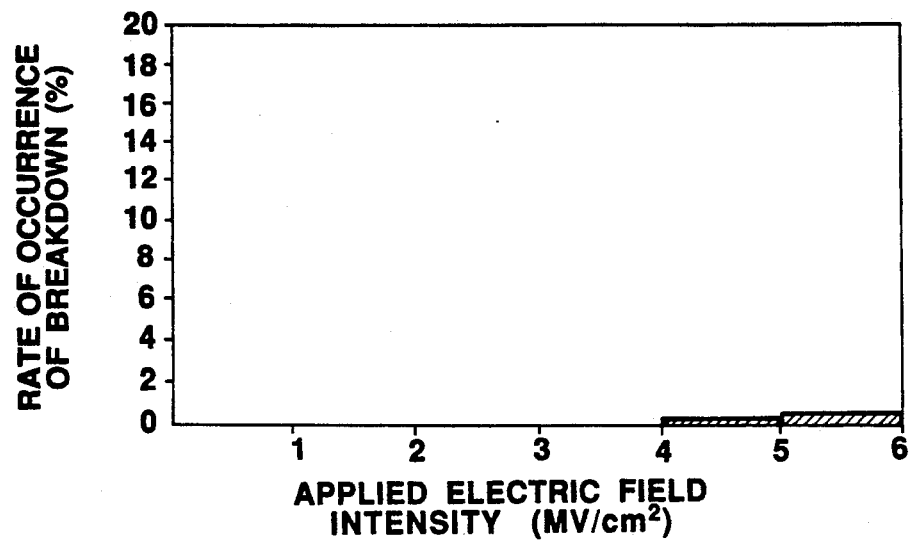
FIG. 15 is a histogram showing a breakdown test result of a silicon-based thin film manufactured by the method of the present invention.

FIG. 15 shows a histogram of a breakdown test result of the silicon nitride film formed under the above film formation conditions. For the sake of comparison, a histogram of a breakdown test result of a silicon nitride film formed under the sam conditions described above except that the RF discharge power density is set to be a conventional value, i.e., 127 mW/cm$^2$ is shown in FIG. 16.

Figure 16:
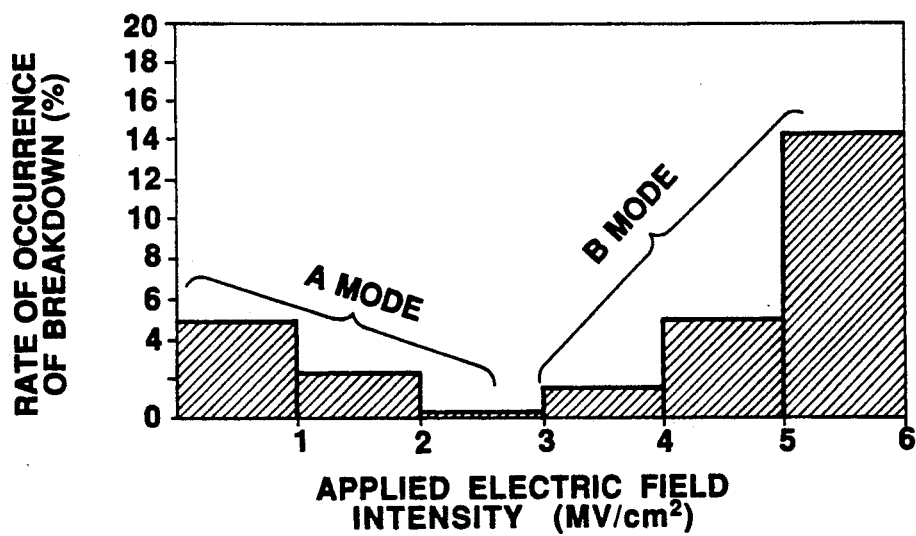
FIG. 16 is a histogram showing a breakdown test result of a silicon-based thin film manufactured by the same method as the conventional technique.
Figure 17:
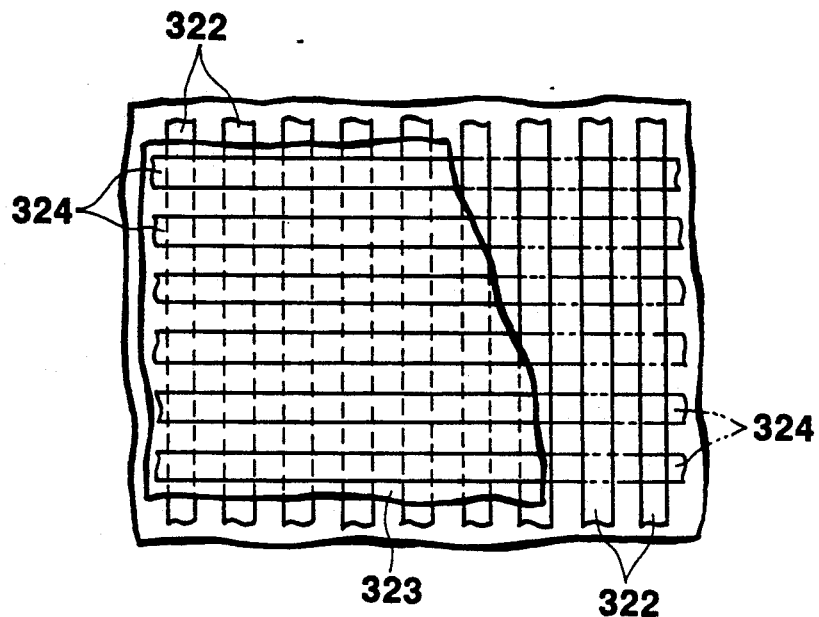
FIG. 17 is a plan view showing a test sample in the breakdown tests of FIGS. 15 and 16.
Figure 18:
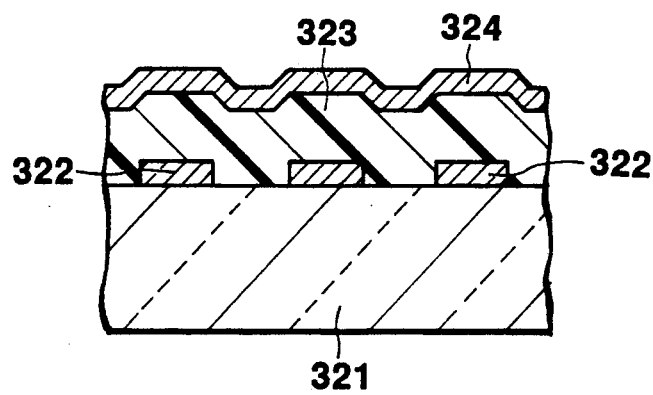
FIG. 18 is a sectional view showing the test sample shown in FIG. 17.

The histograms of the breakdown test results shown in FIGS. 15 and 16 are obtained by measuring breakdown voltages of a silicon nitride film sample shown in FIGS. 17 and 18. This sample is formed such that a plurality of stripe-like lower electrodes 322 are formed parallel to each other on the surface of a glass substrate 321, a silicon nitride film 323 is formed thereon, and a plurality of stripe-like upper electrodes 324 are formed parallel to each other on the silicon nitride film 323 in a direction perpendicular to the lower electrodes 322. A breakdown voltage of the silicon nitride film 323 is measured by the presence/absence of a current flowing through the paper electrodes 324 upon application of a voltage to each lower electrode 322. This is repeated at all intersections between all the lower and upper electrodes 322 and 324. The sample had a total of 691,200 film portions corresponding to the intersections of the upper and lower electrodes and these film portions had a total area of 2.07 cm$^2$. The silicon nitride film 323 was formed to have a thickness of 1,000 Å by a parallel flat plate type plasma CVD apparatus.

Breakdown voltages of the silicon nitride film 323 of a sample having the silicon nitride film 323 formed while the discharge power density was controlled to be 127 mW/cm$^2$ at a film formation temperature of 250° C. were measured by continuously changing a field intensity of the power applied between the electrodes 322 and 324. A rate of occurrence (i.e., a ratio of a breakdown count of the film portions corresponding to the opposite upper and lower electrodes to the total number of the film portions corresponding to the opposite upper and lower electrodes) of breakdown of the silicon nitride film at each field intensity is given, as shown in FIG. 16. A film portion which corresponded to opposite upper and lower electrodes and through which a current of $1 \times 10^{-6}$ A or more flowed was determined as a defective breakdown portion.

As shown in the breakdown histogram of FIG. 16, in a silicon nitride film formed at a film formation temperature of 250° C. and a discharge power density of 127 mW/cm$^2$, an A mode defect (i.e., an initial defect caused by a pinhole) occurring at a low field intensity of 3 MV/cm$^2$ or less was as large as about 5% at 1 MV/cm$^2$ and about 2.5% at 2 MV/cm$^2$. A B mode defect (i.e., a defect caused by a speak spot) occurring at a high field intensity of more than 3 MV/cm$^2$ was as large as about 5.2% at 5 MV/cm$^2$ and about 14.3% at 6 MV/cm$^2$. FIG. 16 shows a breakdown histogram of a silicon nitride film formed at a discharge power density of 127 mW/cm$^2$. When the film formation temperature was set at 250° C., the breakdown test result of the resultant silicon nitride film remained almost the same as that of FIG. 16 even if the discharge power density was changed within the range of 120 to 130 mW/cm$^2$.

The breakdown characteristics of silicon nitride films are estimated to be degraded in accordance with the following mechanism. When a silicon nitride film is formed at a high discharge power density of 127 mW/cm$^2$, expecially in an initial period of film formation, a silicon nitride is discretely dispersed and nonuniformly deposited on the surface of the substrate, and a degree of growth of the silicon nitride film becomes nonuniform to increase defects such as pinholes and weak spots. When a film formation temperature is as high as about 350° C. as in a conventional film formation method, the resultant silicon nitride film can be a dense film free from defects such as pinholes and weak spots. Satisfactory breakdown characteristics of this silicon nitride film can be assured. However, when the film formation temperature is set to about 250° C., a dense silicon nitride film cannot be obtained. As a result, the above defects occur to lower the breakdown voltages.

A silicon nitride film 323 formed at a film formation temperature of 250° C. and a discharge power density of 84 mW/cm$^2$ was use as a sample to measure a breakdown voltage of the film 323 following the same procedure as described above. A rate of occurrence of breakdown of this insulating film at the respective field intensities is given, as shown in FIG. 15. A film portion which corresponded to opposite upper and lower electrodes and through which a current of $1 \times 10^{-6}$ A or more flowed was determined as a defective breakdown portion.

As shown in the breakdown histogram of FIG. 15, in a silicon nitride film formed at a film formation temperature of 250° C. and a discharge power density of 84 mW/cm$^2$, an A mode defect occurrig at a low field intensity of 3 MV/cm$^2$ or less was almost zero. A B mode defect occurring at a high field intensity of more than 3 MV/cm$^2$ was as small as about 0.4% at 5 MV/cm$^2$ and about 0.6% at 6 MV/cm$^2$.

This decrease in rate or occurrence of breakdown is estimated to be caused for the following reason. When the RF discharge power density is decreased to about 84 mW/cm$^2$, a deposition state of a silicon nitride on the substrate surface is averaged, and the silicon nitride film is uniformly grown. When the silicon nitride film is uniformly grown, defects such as pinholes and weak spots are almost eliminated, so that the resultant silicon nitride film has a sufficiently high breakdown voltage.

A silicon nitride film formed by the method of this embodiment can have a very high breakdown voltage. When this silicon nitride film is used as a gate insulating film for a thin film transistor or a MOS integrated circuit element, the rate of occurrence of breakdown of the thin film transistor and the MOS integrated circuit element can be greatly reduced, and the manufacturing yield and reliability of such transistors and circuit elements can be improved. In addition, the thickness of the gate insulating film (silicon nitride film) can be decreased due to its high breakdown voltage. Therefore, even if a voltage applied to a gate electrode remains the same, if a stronger electric field is applied to a semiconductor layer, a large ON current can be obtained.

In the above first method of forming a silicon material film, the RF discharge power density was set to 84 mW/cm$^2$. However, when the discharge power density falls within the range of 60 to 100 mW/cm$^2$, silicon nitride films formed at a discharge power density falling within this range and at a temperature as low as about 250° C. can have breakdown voltages as high as that represented in the breakdown voltage histogram in FIG. 15.

According to the first method of forming a thin film, a silicon nitride film having a sufficiently high breakdown voltage can be obtained at a film formation temperature (about 250° C.) lower than that of the conventional film formation method by about 100° C. A substrate heating time at the time of formation of a silicon nitride film can be shortened, and a substrate cooling time upon formation of the silicon nitride film can also be shortened. The silicon nitride film can be efficiently formed. In the film formation method as described above, since the RF discharge power density is set to fall within the range of 60 to 100 mW/cm$^2$, a film deposition rate is lower than that of the conventional film formation method having an RF discharge power density of 120 to 130 mW/cm$^2$. However, a decrease in deposition rate is smaller than a decrease in heating and cooling times of the substrate. Therefore, no problem is posed by the decrease in deposition rate.

Figure 21:
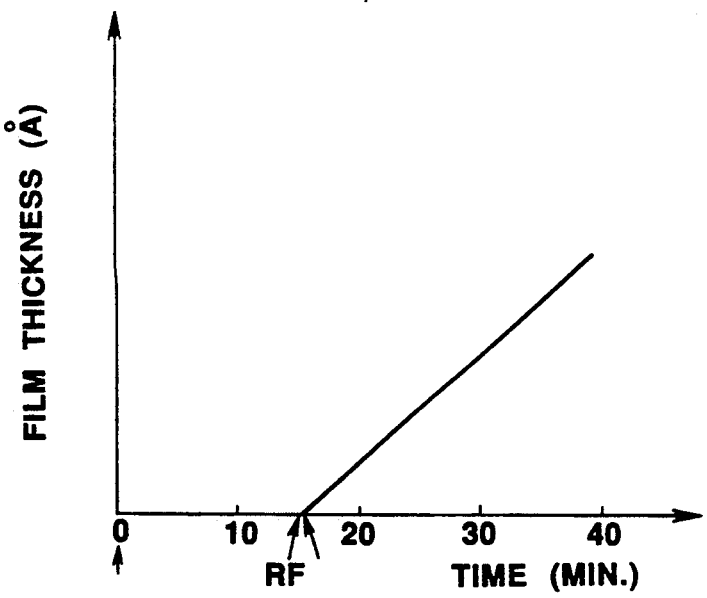
FIG. 21 is a graph showing a relationship between a film formation time and a film thickness in the manufacturing method of the present invention.

750-Å thick silicon nitride films having various composition ratios were formed by changing the flow rate ratio of the process gas while the film formation temperature, the pressure, the RF discharge frequency, and the discharge power density of the above film formation conditions were kept unchanged. The density of defects occurring upon application of a high electric field of 3 MV/cm$^2$ between electrodes 322 and 324 of the silicon nitride film samples having the above composition ratios was measured, as shown in FIG. 21.

Figure 19:
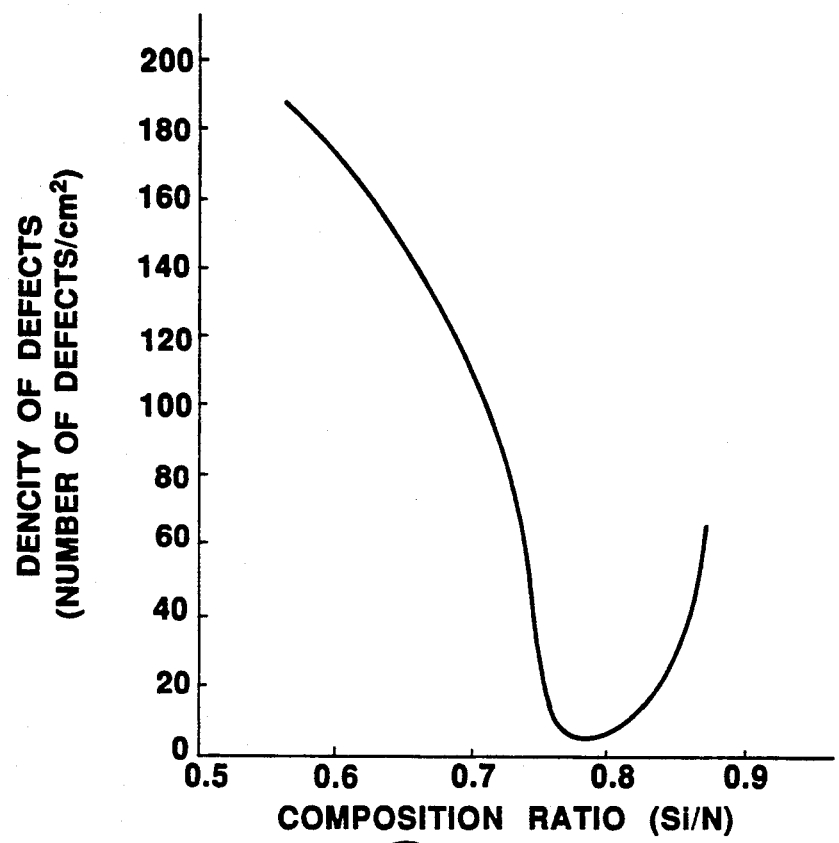
FIG. 19 is a graph showing a relationship between a defect occurrence density and a composition ratio of a silicon-based thin film manufactured by the method of the present invention.

As shown in FIG. 19, the density of defects occurring upon application of the high electric field to the samples varied depending on composition ratios (Si/N) of the samples. A silicon nitride film having a composition ratio of Si/N=0.85 and formed at a gas flow rate ratio of SiH$_4$:NH$_3$:N$_2$=1:1:14 (gas flow rates: 30 cc/M of SiH$_4$; 30 cc/M of NH$_3$; and 420 cc/M of N$_2$) and a silicon nitride film having a composition ratio of Si/N>0.75 and formed at a gas flow rate ratio of SiH$_4$:NH$_3$:N$_2$=1:2.7:12.3 (gas flow rates: 30 cc/M of SiH$_4$; 80 cc/M of NH$_3$ and 370 cc/M of N$_2$) had defect densities as small as 50 defects/cm$^2$ or less. A silicon nitride film having a composition ratio of Si/N falling within the range of 0.75 (exclusive) to 0.85 (inclusive), e.g., a silicon nitride film having a composition ratio of Si/N=0.83 and formed at a gas flow rate ratio of SiH$_4$:NH$_3$:N$_2$=1:2:13 (gas flow rates: 30 cc/M of SiH$_4$; 60 cc/M of NH$_3$; and 390 cc/M of N$_2$) had a smaller defect density of 30 defects/cm$^2$ or less.

As described above, in order to obtain a silicon nitride film having a high breakdown voltage, its composition ratio must be larger than a ratio of the number of Si atoms to that of N atoms stoichiometrically calculated from chemical formula SiN of silicon nitride, i.e., is larger than a value of 0.75 as the chemically stablest state of the ratio of the number of Si atoms to that of N atoms. Preferably, the composition ratio of the silicon nitride film having a high breakdown voltage falls within the range of 0.75 (exclusive) to 0.85 (inclusive).

SECOND FILM FORMING METHOD

The second method will be described below.

Figure 20:
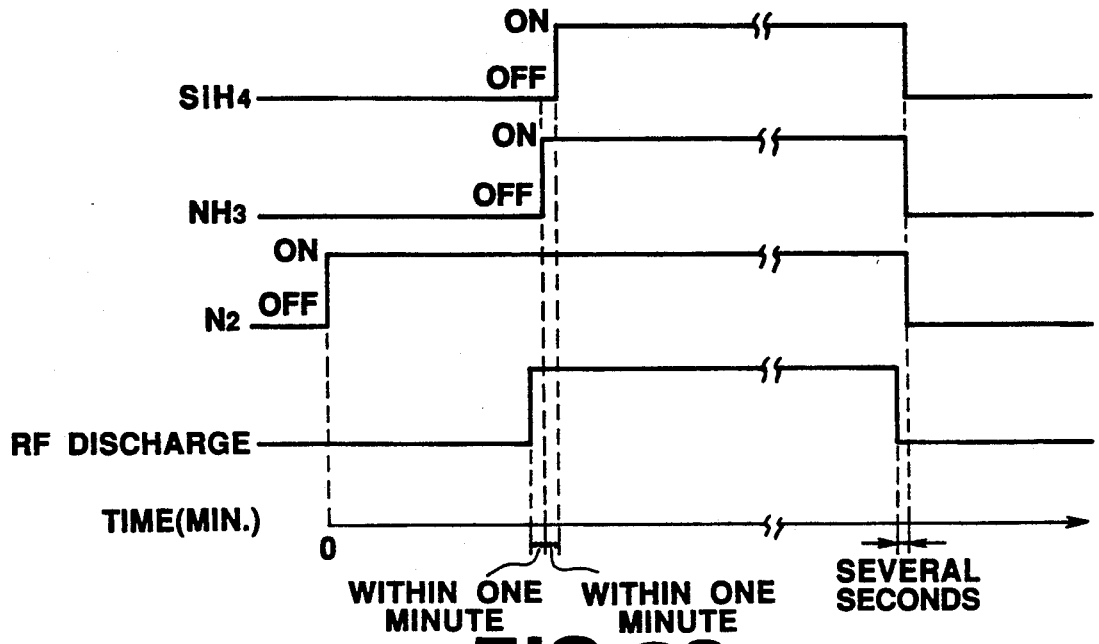
FIG. 20 is a timing chart showing a relationship between a start timing of process gas supply and a start timing of RF discharge in the manufacturing method of the present invention.

In the second method, in addition to the film formation conditions of the first method, an RF discharge power supply timing is optimized to form a silicon-based thin film having a smaller number of defects. FIG. 20 is a timing chart of a process gas supply timing and an RF discharge start timing in formation of a silicon nitride film. A silicon nitride film is formed as follows.

Only the N$_2$ gas serving as a carrier gas is supplied to the chamber first, and the substrate temperature and the internal pressure (gas pressure) of the chamber are adjusted to be a predetermined film formation temperature and a predetermined pressure, respectively. When the substrate temperature and the chamber pressure are stabilized, an RF discharge is started. When the discharge state is stabilized, SiH$_4$ gas and NH$_3$ gas constituting the main reaction gas are supplied to the chamber. When the RF discharge is started and all gases (SiH$_4$, NH$_3$, and N$_2$) required for forming the silicon nitride film are supplied to the chamber, formation of a silicon nitride film is started by a plasma CVD method.

A time required to adjust and stabilize the substrate temperature and the internal pressure of the chamber varies depending on a film formation apparatus and the type of substrate, but must be a minimum of about 15 minutes. A time of several tens of seconds is sufficient to stabilize the RF discharge. The RF discharge can be started when 15 minutes elapse upon supply of N$_2$ gas into the chamber. Supply of the SiH$_4$ and NH$_3$ gases can be started within one minute upon the start of the discharge. The SiH$_4$ and NH$_3$ gases may be simultaneously supplied to the chamber. In order to reduce variations in internal pressure of the chamber by the main reaction gas, the SiH$_4$ and NH$_3$ gases are preferably supplied with a slight time lag, as shown in FIG. 19. With this technique, pressure variations caused by gas supply can be easily corrected. The time lag between supply of the SiH$_4$ gas and supply of NH$_3$ gas is determined by the time required to control the internal pressure of the chamber to a predetermined pressure. In this embodiment, the time lag is about one minute or less. When the SiH$_4$ and NH$_3$ gases are supplied with the time lag, the NH$_3$ gas is preferably supplied first and the SiH$_4$ gas is then supplied.

Gas supply to the chamber and RF discharge in the chamber are intermittently performed during the film formation time determined by the thickness of an SiN film to be formed. When the film formation time elapses, the RF discharge is stopped first, and then supply of gases is stopped with a time lag of several seconds.

In this embodiment, only the N$_2$ gas serving as the carrier gas is supplied to the chamber, and the substrate temperature and the internal pressure of the chamber are adjusted. The RF discharge is then started, and the SiH$_4$ and NH$_3$ gases constituting the main reaction gas are supplied to the chamber. For this reason, a change in thickness of a deposition film as a function of time is linearly increased from the start timing (RF) of the RF discharge, as shown in FIG. 21.

Since the N$_2$ gas supplied to the chamber prior to the start of RF discharge does not contain a material deposited on a substrate upon thermal decomposition, a thermally decomposed material is not deposited on the substrate prior to the RF discharge, unlike in the conventional film formation method. The thickness of the resultant silicon nitride film can be uniform throughout the film. In addition, since the RF discharge is started upon supply of only the N$_2$ gas, a prospective silicon nitride film formation surface (i.e., a substrate surface or a surface of an electrode or the like formed on the substrate surface) of the substrate is plasma-cleaned with the N$_2$ gas. Since the SiN film is formed on the clean surface, the SiN film has uniform quality even at the interface with the deposition surface.

Since the SiH$_4$ and NH$_3$ gases are supplied to the chamber after the RF discharge is started and stabilized, the silicon nitride film formed by the plasma CVD method is uniformly grown throughout the film from the initial period of film formation. The resultant SiN film is free from defects such as pinholes and weak spots and has a high breakdown voltage.

As opposed to the above method, in the conventional method, all the gases are simultaneously supplied to the chamber, and the RF discharge is started after the substrate temperature and the internal pressure of the chamber are stabilized. During a time from the supply of the gases to the chamber to the start of RF discharge, i.e., a time in which the substrate temperature and the internal pressure of the chamber are adjusted, a source gas as an active gas is thermally decomposed and is deposited on the substrate. When the thermally decomposed material of the source gas is attached on the substrate surface prior to the start of RF discharge, a plasma-CVD deposition film formed upon the RF discharge is deposited on the film of the thermally decomposed material.

Since the thermally decomposed material film is nonuniformly attached on the substrate, a degree of growth of the plasma-CVD deposition film becomes nonuniform. Defects such as pinholes and weak spots are formed in the resultant silicon-based thin film. Therefore, the characteristics of the silicon-based thin film become unstable.

Figure 22:
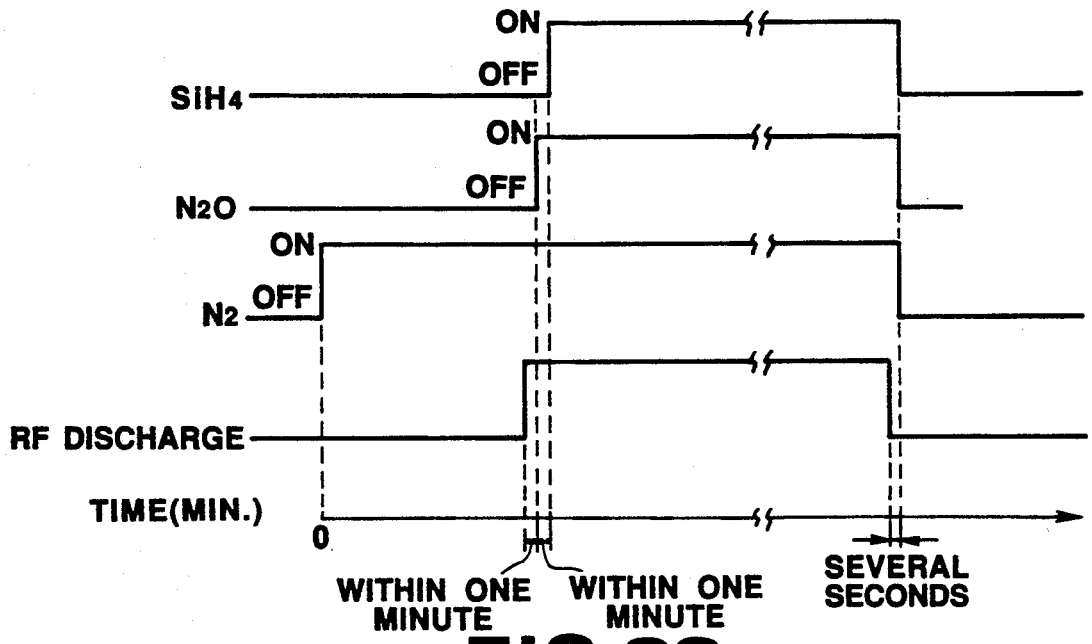
FIG. 22 is a timing chart showing a relationship between a start timing of process gas supply and a start timing of RF discharge when a film different from that a manufacturing method of FIG. 20 is to be formed by a manufactured in the method of the present invention.

The first application example in which the present invention is applied to formation of an SiO film will be described below. FIG. 22 is a timing chart of gas supply and RF discharge in formation of an SiO film. The SiO film is formed as follows.

Only N$_2$ gas as a carrier gas is supplied to the chamber first, and the substrate temperature and the internal pressure of the chamber are adjusted. When the substrate temperature and the internal pressure of the chamber are stabilized, an RF discharge is started. When the discharge state is stabilized, the SiH$_4$ and N$_2$O constituting the main reaction gas are supplied to the chamber, and formation of the SiO film by the plasma CVD method is started. In this embodiment, the SiH$_4$ and N$_2$O gases may be simultaneously supplied the chamber. However, the SiH$_4$ and N$_2$O gases are supplied with a time lag, as shown in FIG. 22, to reduce pressure variations by supply of the gases, and correction of pressure variations can be facilitated. In this case, the N$_2$O gas is preferably supplied first, and then the SiH$_4$ gas is supplied. The RF discharge and gas supply are stopped in the same manner as in the second embodiment described above upon a lapse of the film formation time.

In the first application example, only the N$_2$ gas as a carrier gas is supplied to the chamber first, the substrate temperature and the internal pressure of the chamber are adjusted, and an RF discharge is started. Thereafter, the SiH$_4$ and NO$_2$ gases serving as the reaction gas are supplied to the chamber. Therefore, a change in thickness of the deposition film as a function of time is given, as shown in FIG. 21. An SiO film having uniform quality throughout the film and a high breakdown voltage can be formed in the same manner as in the second embodiment.

Figure 23:
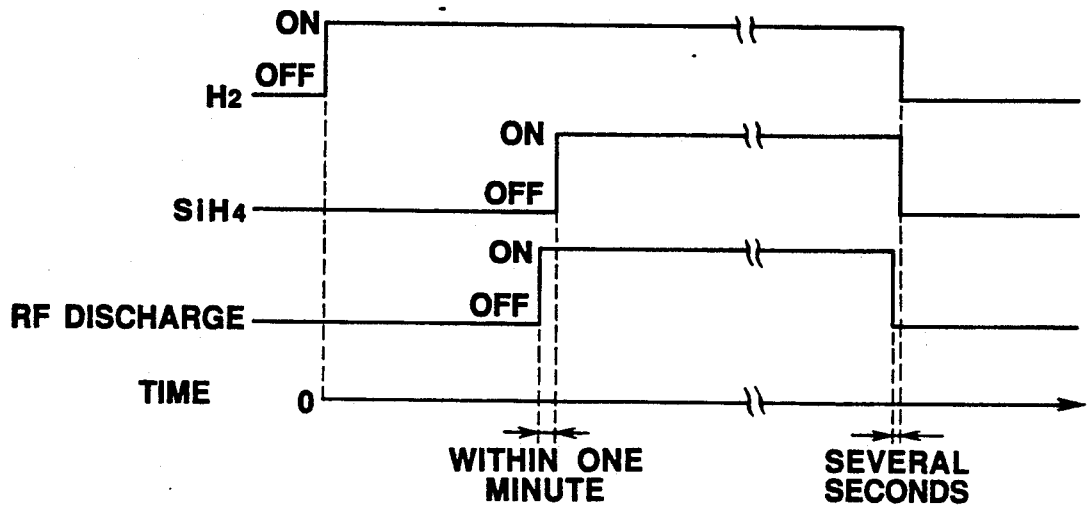
FIG. 23 is a timing chart showing a relationship between a start timing of process gas supply and a start timing of RF discharge when a film different from that manufactured in the method of FIG. 22 is to be formed by a manufacturing method of the present invention.

The second application example in which the present invention is applied to formation of an a-Si:H film will be described below. FIG. 23 is a timing chart of gas supply and RF discharge in formation of an a-Si:H film. The a-Si:H film is formed as follows.

Only H$_2$ gas as a carrier gas is supplied to the chamber first. The substrate temperature and the internal pressure of the chamber are adjusted. When the substrate temperature and the internal pressure of the chamber are stabilized, an RF discharge is started. When the discharge state is stabilized, SiH$_4$ gas serving as a main reaction gas is supplied to start formation of the a-Si:H film by the plasma CVD method. The RF discharge and gas supply are stopped in the same manner as in the second embodiment upon a lapse of the film formation time.

In this application example, only the H$_2$ gas serving as a carrier gas is supplied to the chamber first, the substrate temperature and the internal pressure of the chamber are adjusted, and an RF discharge is started. Thereafter, the SiH$_4$ gas serving as the main reaction gas is supplied to the chamber. A change in thickness of the deposition film as a function of time is given, as shown in FIG. 21. Since the N$_2$ gas supplied to the chamber prior to the start of RF discharge does not contain a material deposited on a substrate upon thermal decomposition, a thermally decomposed material is not deposited on the substrate prior to the RF discharge, unlike in the conventional film formation method. Since the SiH$_4$ gas is supplied to the chamber upon the start of RF discharge, the a-Si:H film formed by the plasma CVD method is uniformly grown throughout the entire area from the initial period of film formation without causing defects such as pinholes and weak spots. The a-Si:H film formed by this formation method has uniform quality throughout the film and stable semiconductor characteristics. In the second application example, the same effect as in the second embodiment, such as a cleaning effect of a film formation surface by a plasma of the $H_2$ gas, can be obtained.

Figure 24:
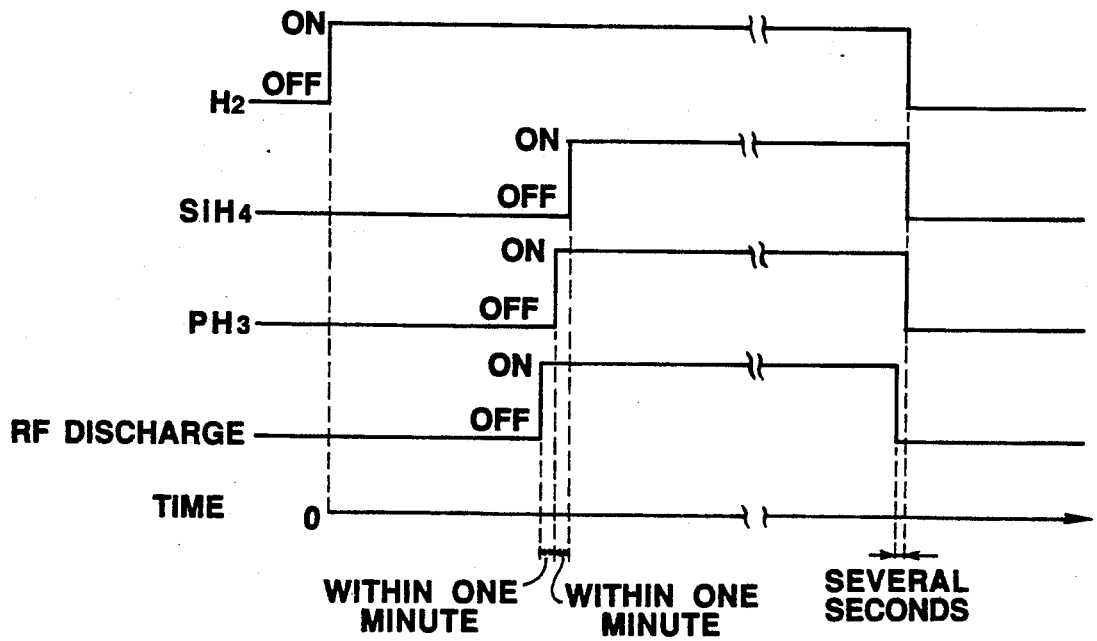
FIG. 24 is a timing chart showing a relationship between a start timing of process gas supply and a star timing of RF discharge when a film different from that manufactured in the method of FIG. 23 is to be formed by a manufacturing method of the present invention.

The third application example in which the present invention is applied to formation of an $n^+$-a-Si film will be described below. FIG. 24 is a timing chart of gas supply and RF discharge in formation of an $n^+$-a-Si film. This $n^+$-a-Si film is formed as follows.

Only $H_2$ gas as a carrier gas is supplied to the chamber first. The substrate temperature and the internal pressure of the chamber are adjusted. When the substrate temperature and the internal pressure of the chamber are stabilized, an RF discharge is started. When the discharge state is stabilized, $SiH_4$ gas and $PH_3$ gas constituting a main reaction gas are supplied to start formation of the $n^+$-a-Si film by the plasma CVD method. In the third application example, the $SiH_4$ and PH3 gases may be simultaneously supplied. When the $SiH_4$ and $PH_3$ gases are supplied with a time lag, as shown in FIG. 19, pressure variations by gas supply can be reduced, and correction of such pressure variations can be facilitated. In this case, the $PH_3$ gas is preferably supplied first, and then the SiH3 gas is supplied to the chamber. The RF discharge and gas supply are stopped in the same manner as in the second embodiment upon a lapse of the film formation time.

In the third application example, only the $H_2$ gas serving as a carrier gas is supplied to the chamber first, the substrate temperature and the internal pressure of the chamber are adjusted, and an RF discharge is started. Thereafter, the $SiH_4$ and $PH_3$ gases constituting the main reaction gas are supplied to the chamber. A change in thickness of the deposition film as a function of time is given, as shown in FIG. 21. Therefore, the entire $n^+$-a-Si film has uniform quality and stable conductive characteristics.

THIRD METHOD

In addition to the first method, the third method aims at manufacturing a defect-free silicon-based thin film by controlling a state at the start of RF discharge.

Figure 25:
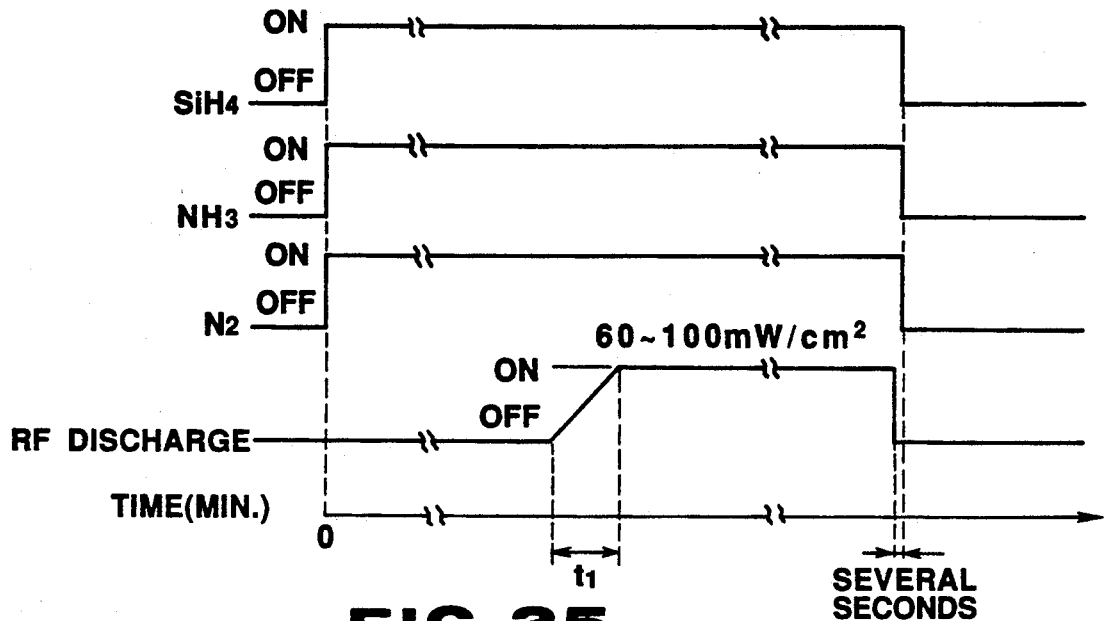
FIG. 25 is a timing chart showing a start timing of RF discharge and an RF discharge power supply state in a manufacturing method of the present invention.

FIG. 25 is a timing chart of gas supply and RF discharge in formation of a silicon nitride film. This silicon nitride film is formed as follows. $SiH_4$, $NH_3$, and $N_2$ constituting a process gas are supplied as a process gas to the chamber. The substrate temperature and the internal pressure (gas pressure) of the chamber are adjusted to a predetermined film formation temperature and a predetermined pressure, respectively. When the substrate temperature and the internal pressure of the chamber are stabilized, an RF discharge is started. At the time of the start of RF discharge, a rate of increase in discharge power density to a set value (60 to 100 $mW/cm^2$) is controlled to fall within the range of 3 to 10 $mW/cm^2$ per second. A time $t_1$ required to increase the discharge power density to the set value at this rate of change is 10 to 20 seconds. A relationship between the time $t_1$, the set value of the discharge power density, and the rate of increase in discharge power density is summarized in [Table 5].

TABLE 5

| Set value (mW/cm²) | Rate of Increase (mW/cm²) per second) | Time (sec.) |
|---|---|---|
| 60 | 6 | 10 |
| 60 | 3 | 20 |
| 100 | 10 | 10 |
| 100 | 5 | 20 |

After the discharge power density is increased to the set value, the discharge power density is maintained at the set value for the film formation time determined by the thickness of a silicon nitride film to be formed. When the film formation time elapses, the RF discharge is stopped. Supply of the process gas is stopped with a time lag of several seconds.

In the third method, when RF discharge is started, the discharge power density is gradually increased to the set value at a rate of increase of 3 to 10 $mW/cm^2$ per second, and the discharge power density can be increased in a stable discharge state. For this reason, SiN deposited on the substrate can be uniformly deposited from the initial period of film formation. In addition, since the discharge power density is gradually increased, the deposition film is gradually grown during the film formation time, and the deposition film in the initial period of film formation can be dense. When the deposition film in the initial period of film formation is uniform and dense, a degree of growth of a film deposited thereon becomes uniform. The resultant silicon nitride film becomes a film which is free from defects such as pinholes and weak spots and which has stable characteristics. This SiN film has a sufficiently high breakdown voltage.

In the third method, a rate of increase in discharge power density is set to fall within the range of 3 to 10 $mW/cm^2$ per second due to the following reason. When a rate of increase in discharge power density is higher than 10 $mW/cm^2$ per second or more, uniformity and denseness of the deposition film in the initial period of film formation are lost. When the rate of increase in discharge power density is decreased, the uniformity and denseness of the deposition film in the initial period of film formation can be improved. When the rate of increase is less than 2 $mW/cm^2$ per second or less, it takes much time to set the discharge power density to the set value, thus degrading film formation efficiency. Therefore, the rate of increase in discharge power density preferably falls within the range of 2 to 10 $mW/cm^2$ per second. Within this range, an SiN film having stable characteristics and free from defects such as pinholes and weak spots can be obtained without greatly degrading film formation efficiency.

To the contrary, in the conventional film formation method, at the start of RF discharge, the discharge power density is increased quickly within a very short period of 1 to 2 seconds. When the discharge power density is quickly increased within a short period of time, a discharge state becomes unstable, and the silicon-based material deposited on the substrate in the initial period of film formation is nonuniformly deposited.

When the silicon-based material in the initial period of film formation is deposited on the substrate in a dispersed manner, a degree of growth of the deposition film becomes nonuniform. For this reason, in the conventional film formation method, defects such as pinholes and weak spots are formed in the resultant silicon-based thin film, so that the characteristics of the silicon-based thin film become unstable.

Figure 26:
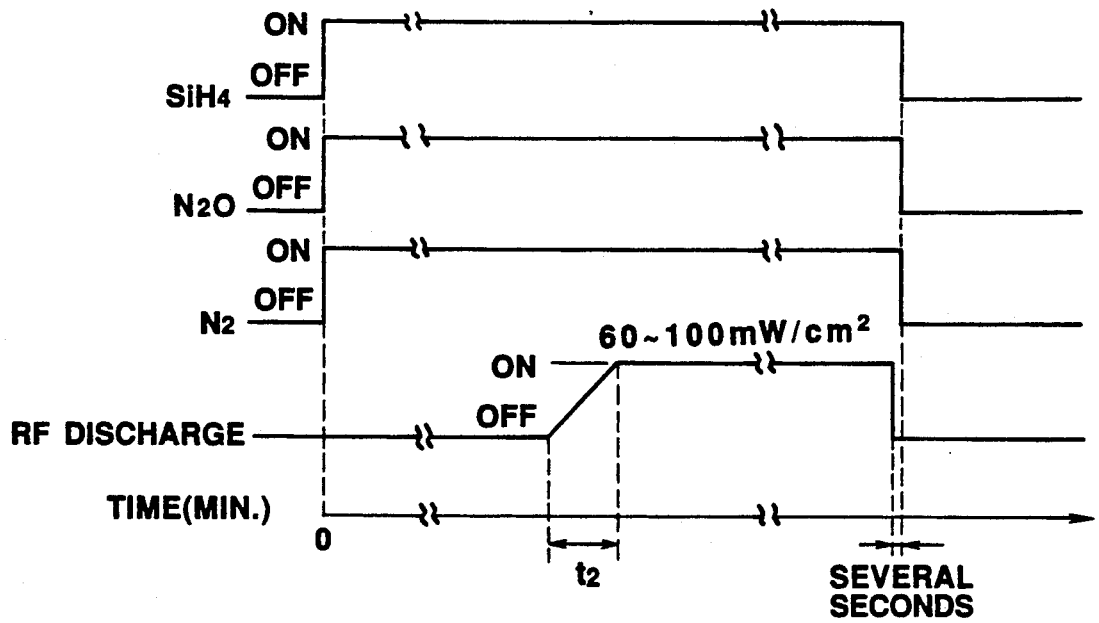
FIG. 26 is a timing chart showing a start timing of RF discharge and an RF discharge power supply state when a film different from a film formed by the manufacturing method of FIG. 25 is to be formed by a manufacturing method of the present invention.

The first application example in which the third method is applied to formation of an SiO film. FIG. 26 is a timing chart of gas supply and RF discharge in formation of an SiO film. The SiO film can be formed as follows.

$SiH_4$, $N_2O$, and $N_2$ gases constituting a process gas are supplied as a process gas, the substrate temperature and the internal pressure of the chamber are adjusted, and an RF discharge is started. At the time of the start of RF discharge, a rate of increase in discharge power density to a set value is controlled to fall within the range of 3 to 10 $mW/cm^2$ per second. In this case, the set value of the discharge power density in formation of the SiO film is the same (60 to 100 $mW/cm^2$) as in formation of the SiN film in the third method A relationship between a time $t_2$ required to increase the discharge power density to the set value, the set value of the discharge power density, and the rate of increase in discharge power density is the same as the above [Table 5]. The RF discharge and the gas supply are stopped in the same manner as in the third method upon a lapse of the film formation time.

At the time of the start of RF discharge in this first application example. since the discharge power density is slowly increased to the set value at a rate of 3 to 10 $mW/cm^2$ per second, an SiO film free from defects such as pinholes and weak spots and having stable characteristics can be obtained.

In the above first application of the third method, the rate of increase in discharge power density is set to fall within the range of 3 to 10 $W/cm^2$ per second.

This rate may be 2 to 10 $mW/cm^2$ per second in the same manner as in the third method.

Figure 27:
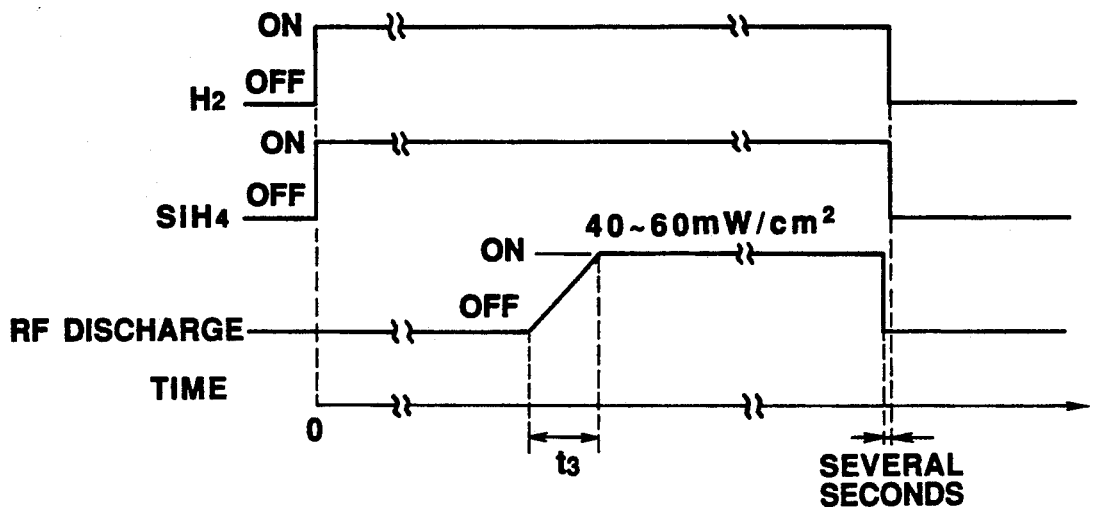
FIG. 27 is a timing chart showing a start timing of RF discharge and an RF discharge power supply state when a film different from a film formed by the manufacturing method of FIG. 26 is to be formed by a manufacturing method of the present invention.

A second application example in which the third method is applied to formation of an a-Si:H film will be described below. FIG. 27 is a timing chart of gas supply and RF discharge in formation of an a-Si:H film. This a-Si:H film is formed as follows.

$SiH_4$ and $H_2$ gases constituting a process gas are supplied to the chamber, the substrate temperature and the internal pressure of the chamber are adjusted, and an RF discharge is started. At the time of the start of RF discharge, a rate of increase in discharge power density to a set value (40 to 60 $mW/cm^2$ in formation of the a-Si:H film) is set to fall within the range of 2 to 5 $mW/cm^2$ per second. A relationship between a time $t_3$ required for increasing the discharge power density to the set value at this rate, the set value of the discharge power density, and the rate of increase in discharge power density is summarized in [Table 6] below.

TABLE 6

| Set value (mW/cm²) | Rate of Increase (mW/cm²) per second | Time (sec.) |
|---|---|---|
| 40 | 4 | 10 |
| 40 | 3 | 20 |
| 50 | 5 | 10 |
| 50 | 2.25 | 20 |

After the discharge power density is increased to the set value, the discharge power density is maintained at the set value for the film formation time determined by the thickness of an a-Si:H film to be formed. When the film formation time elapses, the RF discharge is stopped. Supply of the process gas is stopped with a time lag of several seconds.

In the second application example of the third method, at the time of the start of RF discharge, since the discharge power density is slowly increased to the set value in the range of 2 to 5 $mW/cm^2$ per second, the discharge power density can be increased in a stable discharge state. The a-Si:H film deposited on the substrate is uniformly deposited from the initial period of film formation. In addition, when the discharge power density is slowly increased, the deposition film is slowly grown, and a dense film is obtained in the initial period of film formation. When the deposition film in the initial period of film formation is uniform and dense, a degree of growth of a film formed thereon becomes uniform. The resultant a-Si:H film is free from defects such as pinholes and weak spots and has stable characteristics. This a-Si:H film has good semiconductor characteristics.

In this second application example of the third method, the uniformity and denseness of the deposition film in the initial period of film formation can be improved when the rate of increase in discharge power density is decreased. However, if this rate of increase is excessively low, it takes a long period of time to set the actual discharge power density to the set value, thus degrading film formation efficiency. The rate of increase in discharge power density preferably falls within the range of 2 to 10 $mW/cm^2$ per second. Within this range, a stable a-Si:H film free from defects such as pinholes and weak spots and having stable characteristics can be obtained without excessively degrading the film formation efficiency.

Figure 28:
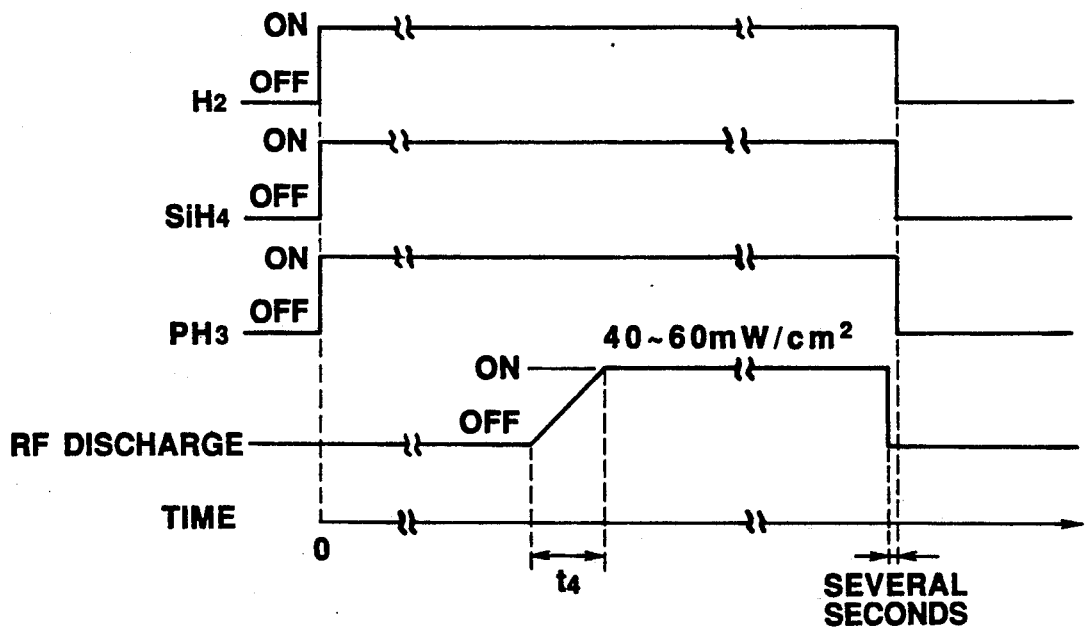
FIG. 28 is a timing chart showing a start timing of RF discharge and an RF discharge power supply state when a film different from a film formed by the manufacturing method of FIG. 27 is to be formed by a manufacturing method of the present invention.

A third application example in which the third method is applied to formation of an $n^+$-a-Si film will be described below. FIG. 28 is a timing chart of gas supply and RF discharge in formation of $n^+$-a-Si film. The $n^+$-a-Si film is formed as follows.

$SiH_4$, $PH_3$, and $H_2$ gases constituting a process gas are supplied to the chamber, the substrate temperature and the internal pressure of the chamber are adjusted, and an RF discharge is started. At the time of the start of RF discharge, a rate of increase in discharge power density to a set value is controlled to fall within the range of 2 to 5 $mW/cm^2$ per second. The set value of the discharge power density in formation of this $n^+$-a-Si film is 40 to 60 $mW/cm^2$ as information of the a-Si:H film of the second application example of the third embodiment. A relationship between a time $t_4$ required to increase the discharge power density to the set value, the set value of the discharge power density, and the rate of increase in discharge power density is the same as that in [Table 6]. The RF discharge and the gas supply are stopped in the same manner as in the third embodiment upon a lapse of the film formation time.

In the third application example of the third method, at the time of the start of RF discharge, since the discharge power density is slowly increased to the set value in the range of 2 to 5 $mW/cm^2$ per second, the resultant $n^+$-a-Si film is free from defects such as pinholes and weak spots and has stable characteristics. This $n^+$-a-Si film has good conductive characteristics.

In the third application example of the third method, the rate of increase in discharge power density is set to fall within the range of 3 to 10 $mW/cm^2$ per second but may fall within the range of 2 to 10 $mW/cm^2$ per second as in the second application example of the third embodiment.

As described above, according to the method of forming silicon-based thin films, the RF discharge power density is reduced to fall within the range of 60 to 100 mW/cm$^2$ to form a silicon nitride film having a high breakdown voltage at a film formation temperature of 230° C. to 270° C. As in the second method, a composition of the process gas can be selected to set a composition ratio of a silicon nitride film to be larger than a stoichiometric ratio, thereby forming a silicon nitride film having a high breakdown voltage. In addition, as in the second and third methods, supply of a process gas and a start timing of RF discharge are controlled, or a rate of increase in RF discharge power is controlled to obtain a silicon nitride film having a high breakdown voltage. According to the methods as described above, when the technique of the first method is combined with at least one of the techniques of the second and third methods, a silicon nitride film or a silicon oxide film which is almost free from defects and having a high breakdown voltage can be formed at low film formation temperatures. For example, an RF discharge power density is reduced to fall within the range of 60 to 100 mW/cm$^2$, a process gas consisting of a main reaction gas (i.e., SiH4 and NH3) and a carrier gas (i.e., N$_2$) is used, and a gas flow rate ratio is set to be 1:1:14 to 1:2.7:12.3. In this case, the carrier gas may be supplied first, the RF discharge may be started, and then the main reaction gas may be supplied to the chamber.

FOURTH METHOD

Figure 29:
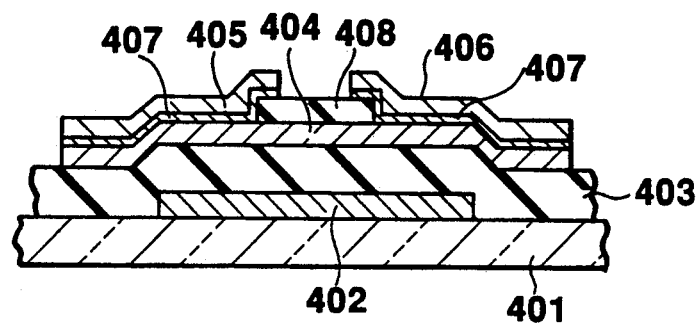
FIG. 29 is a sectional view showing a structure of a TFT manufactured by the method of the present invention.

Methods of forming silicon-based thin films of the first to third method can be applied to a method of manufacturing a thin film used in a TFT-LCD. FIG. 29 shows a structure of a TFT manufactured by the method of the present invention. Referring to FIG. 29, a gate electrode 402 consisting of a metal such as titanium-containing aluminum is formed on an insulating substrate 401 made of glass or the like, and a gate insulating film 403 is formed on the gate electrode 402. An i-type semiconductor film 404 consisting of i-type amorphous silicon (i-a-Si) is formed on the gate insulating film 403 so as to oppose the gate electrode 402. A blocking layer 408 is formed on the upper central portion of the i-type semiconductor film 404 so as to cover its channel region. Source and drain electrodes 405 and 406 consisting of a metal such as chromium are formed at end portions of the i-type semiconductor film 404 to be in ohmic contact with the i-type semiconductor film 404 through an n-type semiconductor layer 407 consisting of impurity-doped n-type amorphous silicon (n+-a-Si).

A method of manufacturing this TFT will be described below.

The TFT shown in FIG. 29 will be manufactured by the following steps.

A metal film consisting of titanium-containing aluminum is formed on an insulating substrate 401 by a sputtering method and is patterned to form a gate electrode 402 (FIG. 30).

Figure 30A:
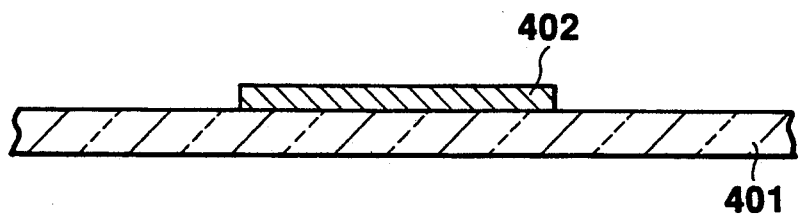
FIGS. 30A, 30B, 30C, and 30D are sectional views showing steps in manufacturing the TFT shown in FIG. 29.
Figure 30B:
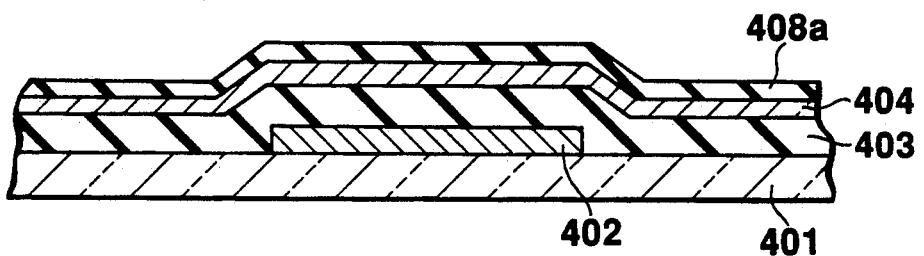

A silicon nitride film serving as a gate insulating film 403, an i-a-Si film serving as an i-type semiconductor film 404, and a silicon nitride film 408a serving as a blocking layer are continuously formed on the gate electrode 402 and the entire surface of the substrate 401 having the gate electrode 402 thereon (FIG. 30B).

The gate insulating film 403, the i-type semiconductor film 404, and the silicon nitride film 408a are continuously formed by using a plasma CVD apparatus as follows.

Figure 31:
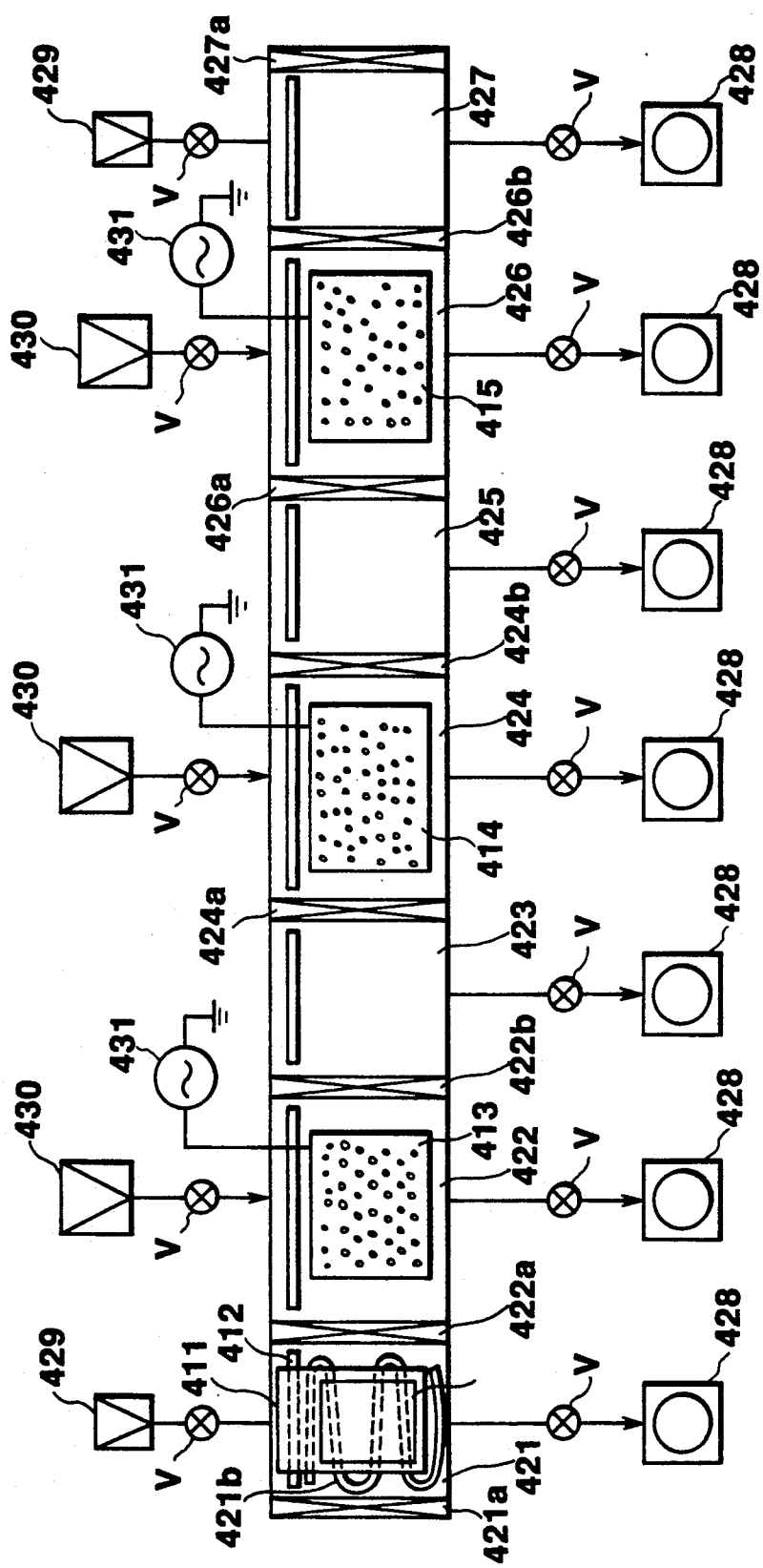
FIG. 31 is a schematic view of a plasma CVD apparatus used in the manufacturing method of the present invention.

FIG. 31 shows an arrangement of the plasma CVD apparatus used in formation of the gate insulating film 403, the i-a-Si layer 404, and the silicon nitride film 408a. This CvD apparatus comprises a substrate loading chamber 421, a silicon nitride film formation chamber (to be referred to as a gate insulating film formation chamber hereinafter) 422 for forming the gate insulating film, a first transfer chamber 423, an amorphous silicon film formation chamber (to be referred to as an i-a-Si formation chamber hereinafter) 424 for forming the i-a-Si layer, a second transfer chamber 424, a silicon nitride film formation chamber (to be referred to as a blocking layer formation chamber hereinafter) 426 for forming the blocking layer (silicon nitride film 408a), and a substrate unloading chamber 427. These chambers are formed contiguous to each other.

The gate insulating film formation chamber 422, the i-type semiconductor film formation chamber 424, and the blocking layer formation chamber 426 have the same structure as those in the plasma CVD apparatus shown in FIG. 14. A vacuum pump 428 is connected to each chamber through a valve V. Inert gas supply units 429 are connected to the substrate loading chamber 421 and the substrate unloading chamber 427 through valves V, respectively. A process gas supply unit 430 and a high-frequency power source 431 are connected to each of the gate insulating film formation chamber 422, the i-a-Si film formation chamber 424, and the blocking layer formation chamber 426, respectively.

In the plasma CVD apparatus shown in FIG. 31, an inert gas is supplied to the substrate loading chamber 423, and a door 421a is opened to mount a substrate holder 421 having substrates 401 thereon on a holder moving mechanism 412 in the chamber. The door 421a is then closed. In the substrate loading chamber 421, the substrates 401 are heated to a predetermined temperature of 230° C. to 270° C. as the film formation temperature range, for example, to a temperature of 250° C. of the first embodiment by a heater 421b. After the substrates are heated to the predetermined temperature, the substrate loading chamber 421 is evacuated, and a door 422a of the gate insulating film formation chamber 422 is opened to transfer the substrate holder 411 to the gate insulating film formation chamber 422. The substrates 401 are set to oppose RF electrodes 413. Thereafter, a process gas is supplied to the gate insulating film formation chamber 422. A high-frequency power is supplied from the high-frequency power source 431 to the RF electrodes 413 while the substrate temperature is kept at 250° C. to start an RF discharge, thereby depositing an SiN film on each substrate. In this case, the RF discharge power density is controlled to be 60 to 100 mW/cm$^2$.

When each SiN film has a predetermined thickness, and formation of the gate insulating films on the respective substrates 401 is completed, a door 422b is opened to transfer the substrates 401 to the first transfer chamber 123. After the door 422b is closed, the gas in the chamber 423 is discharged. When the gas in the first transfer chamber 423 is completely discharged, a door 424a of the i-a-Si film formation chamber is opened, and the substrates 401 mounted on the substrate holder 411 are transferred to the i-a-Si film formation chamber 424. The substrates 401 are set to oppose RF electrodes 414. Thereafter, a process gas is supplied to the i-a-Si film formation chamber 424, and a high-frequency power is supplied from the high-frequency power source 431 to the RF electrodes 414 to start an RF discharge while the substrate temperature is kept a 250° C., thereby depositing an i-a-Si film on each substrate. In this case, the RF discharge power density is controlled to be 40 to 50 mW/cm$^2$.

When the i-a-Si film on each substrate has a predetermined thickness, and formation of i-type semiconductor films on the respective substrates is completed, a door 424b is opened to transfer the substrates 401 to the second transfer chamber 425. After the door 424b is closed, the gas in the chamber 425 is discharged. When the gas in the second transfer chamber 425 is completely discharged a door 426a of the blocking layer formation chamber 426 is opened to transfer the substrates 401 mounted on the substrate holder 421 to the blocking layer formation chamber 426 The substrates 401 are set to oppose RF electrodes 415. A process gas is supplied to the blocking layer formation chamber 426, and a high-frequency power is supplied form the high-frequency power source to the RF electrodes 415 to start an RF discharge while the substrate temperature is kept at 250° C. An SiN film is deposited on each substrate. In this case, the RF discharge power density is controlled to be 60 to 100 mW/cm$^2$ as in the film formation condition of the gate insulating film.

When the SiN film on each substrate has a predetermined thickness and formation of blocking layers on the respective substrates is completed, a door 426b is opened to transfer the substrates 401 to the substrate unloading chamber 427. After the door 426b is closed, an inert gas is supplied to the substrate unloading chamber 427 to restore the internal pressure to the atmospheric pressure and to cool the substrates 401 to room temperature. A door 427a is opened to remove the cooled substrates 40 together with the substrate holder 411 outside the chamber 427.

During the process of film formation, it takes a long period of time to heat the substrates to a silicon nitride film formation temperature and to cool the substrates 401 before they are removed from the substrate unloading chamber 427 so as to protect the formed SiN and i-a-Si films from crocks caused by thermal distortion.

During the film formation, the process gases supplied to the gate insulating film formation chamber and the blocking layer formation chamber are the same as those in the first embodiment. That is, monosilane or disilane gas and ammonia gas constitute a main reaction gas, and nitrogen, hydrorgen, helium, or a mixture thereof is used as a carrier gas. When SiH$_4$ and NH$_3$ constitute a main reaction gas and N$_2$ is used as a carrier gas, a mixing ratio of SiH$_4$, NH$_3$, and N$_2$ is 1:1:14 to 1:2.7:12.3. In the above embodiment, the films are formed under the same conditions as in the first embodiment.

The process gas supplied to the i-a-Si film formation chamber 424 consists of monosilane gas as a main reaction gas and hydrogen as a carrier gas.

Figure 30C:
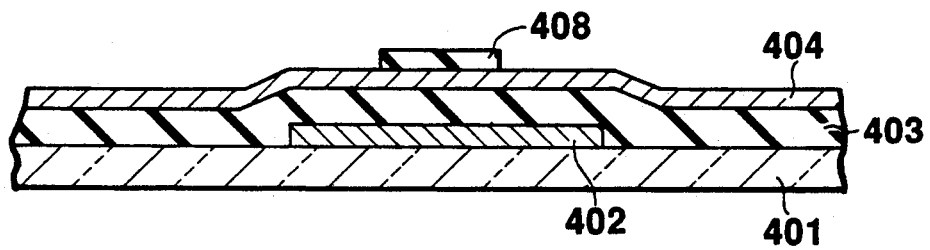
Figure 30D:
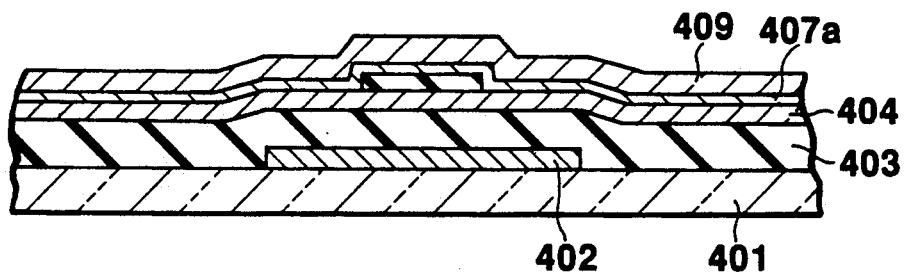

The silicon nitride film 408a of the stack of the silicon nitride film 403, the i-a-Si film 404, and the silicon nitride film 408a continuously formed on the substrate is patterned into a shape corresponding to that of the channel region, thereby forming the blocking layer 408 (FIG. 30C).

An n$^+$-a-Si film 407a for obtaining an ohmic contact with the i-a-Si film, and a metal film 409 are continuously formed on the i-a-Si film 404 (FIG. 32D).

The n$^+$-a-Si film 407a and the metal layer 409 are patterned to have shapes corresponding to the source and drain electrodes 405 and 406, thereby forming a TFT shown in FIG. 29.

The SiN film serving as the gate insulating film, the SiN serving as the blocking insulating film, and the i-a-Si layer serving as the i-type semiconductor layer are formed at about 250° C. Therefore, the gate insulating film, the blocking layer, and the i-type semiconductor layer car be continuously formed without adjusting the substrate temperature during film formation. According to this manufacturing method, the time required for forming the gate insulating film, the blocking layer, and the i-type semiconductor layer can be greatly shortened and a thin film transistor can be manufactured with high efficiency.

In this manufacturing method, the gate SiN film, the blocking SiN film, and the i-a-Si layer are formed at about 250° C. Since the i-a-Si layer is formed at this film formation temperature, the semiconductor characteristics of the i-a-Si layer are not degraded.

Since the gate SiN film and the blocking SiN film are formed at the RF discharge power density of 60 to 100 mW/cm$^2$, the gate and blocking SiN films can have sufficiently high breakdown voltages even if the film formation temperature is as low as about 250° C.

According to this manufacturing method, a thin film transistor having excellent characteristics can be obtained wherein the i-type semiconductor layer has excellent semiconductor characteristics and the gate insulating film has a sufficiently high breakdown voltage.

The above embodiment exemplifies an inverted staggered type thin film transistor having a blocking insulating film. However, the present invention is also applicable to the manufacture of an inverted staggered type thin film transistor having no blocking insulating film. In this case, a gate insulating film, an i-type semiconductor film, and an n-type semiconductor layer can be continuously formed. In this case, a plasma CvD apparatus having an n$^+$-a-Si film formation chamber is used in place of the plasma CVD apparatus having the blocking layer formation chamber 426 shown in FIG. 31.

Figure 32:
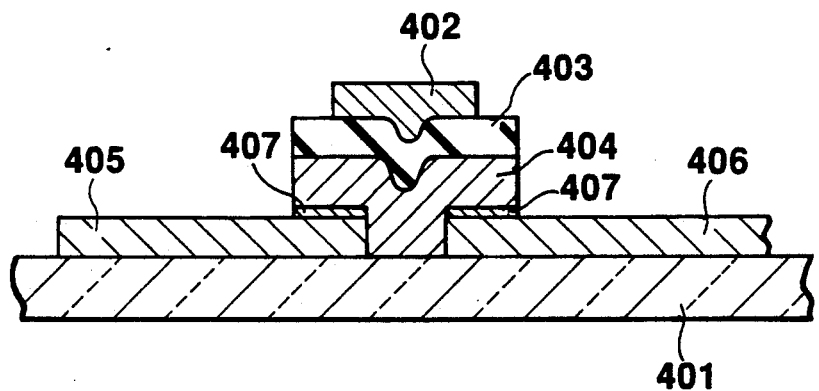
FIG. 32 is a sectional view of a structure of a TFT which is manufactured by the method of the present invention and different from that shown in FIG. 31.

The present invention is also applicable to the manufacture of a staggered type thin film transistor having an inverted structure of an inverted staggered type thin film transistor. A staggered type TFT is shown in FIG. 32. The same reference numerals as in FIG. 29 denote the same parts in FIG. 32. In this case, an i-a-Si layer 404 and a gate insulating film 403 are continuously formed. In this case, the plasma CVD apparatus has a substrate loading chamber, an i-type semiconductor layer formation chamber, a gate insulating film formation chamber, and a substrate unloading chamber, all of which are contiguous to each other.

FIFTH EMBODIMENT

The fifth embodiment provides a TFT wherein a gate insulating film has a two-layered structure consisting of an SiN film having a high breakdown voltage and an SiN film having a good interface property with an i-type semiconductor film. This embodiment will be described in detail.

Figure 33:
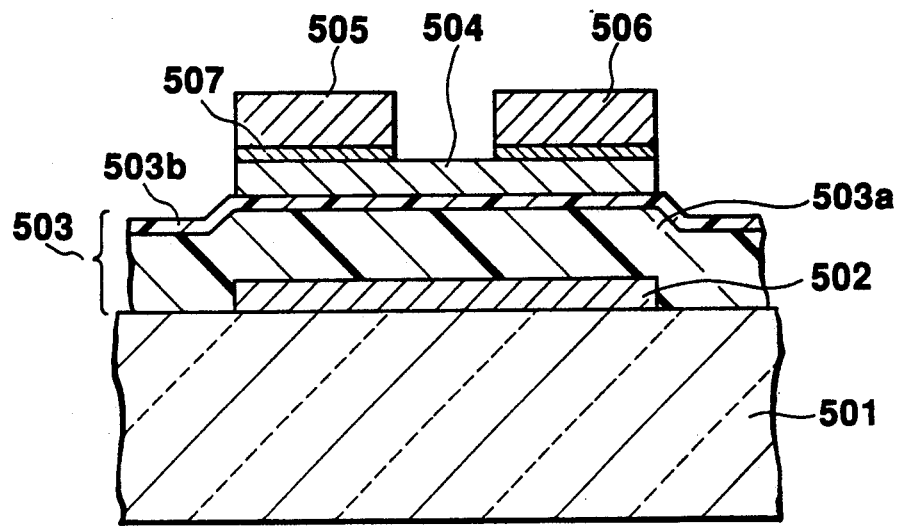
FIG. 33 is a sectional view of a structure of a TFT which is manufactured by the method of the present invention and different from that shown in FIG. 32.

In the thin film transistor of the fifth embodiment, as shown in FIG. 33, a gate electrode 502 is formed on an insulating substrate 501 consisting of glass, and a gate insulating film 503 is formed on the gate electrode 503. A semiconductor layer 504 consisting of amorphous silicon or polysilicon is formed on the gate insulating film 503 so as to oppose the gate electrode 502. Source and drain electrodes 505 and 506 are formed at both end portions of the semiconductor layer 504 via an ohmic contact layer 507 consisting of impurity-doped n-type amorphous silicon or polysilicon.

Figure 34:
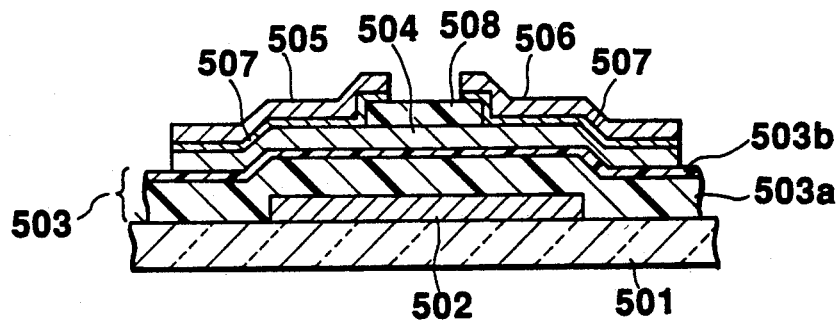
FIG. 34 is a sectional view of a structure of a TFT which is manufactured by the method of the present invention and different from that shown in FIG. 33.

This embodiment is also applicable to a TFT shown in FIG. 34. In this TFT, a blocking layer is formed on a portion corresponding to a channel region of an i-type semiconductor layer. The same reference numerals as in FIG. 33 denote the same parts in FIG. 34, and a detailed description thereof will be omitted.

A gate insulating film 503 consists of an Si-rich silicon nitride film 503a having a larger number of silicon atoms (Si) than that represented by a stoichiometric ratio (Si/N=0.75), and an N-rich silicon nitride film 503b formed in a portion of the gate insulating film 503 near the interface with a semiconductor layer 504 and having a larger number of nitrogen atoms (N) than that represented by the stoichiometric ratio. The thickness of the gate insulating film 503 is about 1,100 Å, and the thickness of the N-rich silicon nitride film 503b at the interface with the semiconductor layer 504 is about 100 Å.

The silicon nitride film 503a having a larger number of silicon atoms in the gate insulating film 503 is formed by a plasma CVD apparatus in accordance with the following film formation conditions:

| Substrate Temperature: | | 250° C. |
|---|---|---|
| Main Reaction Gas: | SiH$_4$ | 30 cc/M |
| | NH$_3$ | 60 cc/M |
| Carrier Gas: | N$_2$ | 390 cc/M |
| Pressure: | | 0.5 Torr |
| RF Discharge Frequency: | | 13.56 MHz |
| Discharge Power Density: | | 84 mW/cm$^2$ |

A composition ratio of the silicon nitride film formed at an RF discharge power density of 84 mW/cm$^2$ is Si/N=0.83.

The N-rich silicon nitride film 503b at the interface with the semiconductor layer 504 is formed by a plasma CVD apparatus under the same conditions as formation of the silicon nitride film having a larger number of silicon atoms, except that the RF discharge power density is controlled to be 127 mW/cm$^2$. In this manner, a composition ratio of the silicon nitride film formed at the RF discharge powder density of 127 mW/cm$^2$ is Si/N=0.69.

In this thin film transistor of the fifth embodiment, since the gate insulating film 503 includes a silicon nitride film having a larger number of silicon atoms than that represented by the stoichiometric ratio, the gate insulating film 503 has a sufficiently high breakdown voltage as in the first embodiment.

Since the silicon nitride film 503a having a larger number of silicon atoms than that represented by the stoichiometric ratio is mainly used to form the gate insulating film 503, breakdown between the gate electrode 502 and the source and drain electrodes 505 and 506 is perfectly prevented in the thin film transistor of this embodiment. In addition, since the thickness of the gate insulating film 503 can be as small as about 1,100 Å, a stronger electric field can be applied to the semiconductor layer 504 to increase an ON current even if the gate voltage applied to the gate electrode 502 remains the same.

If the gate insulating film 503 consists of a silicon nitride film 503a having a larger number of silicon atoms than that represented by the stoichiometric ratio, hysteresis characteristics appear in the $V_G$-$I_D$ characteristic curve of the thin film transistor. In the thin film transistor of this embodiment, since the silicon nitride film 503b having a larger number of nitrogen atoms than that represented by the stoichiometric ratio is formed at an interface of the gate insulating film 503 with the semiconductor layer 504 and the hysteresis characteristics of the $V_G$-$I_D$ characteristic curve is determined by a film composition at the interface of the gate insulating film 503 with the semiconductor layer 504, the thin film transistor has good $V_G$-$I_D$ characteristics without hysteresis characteristics.

Figure 35:
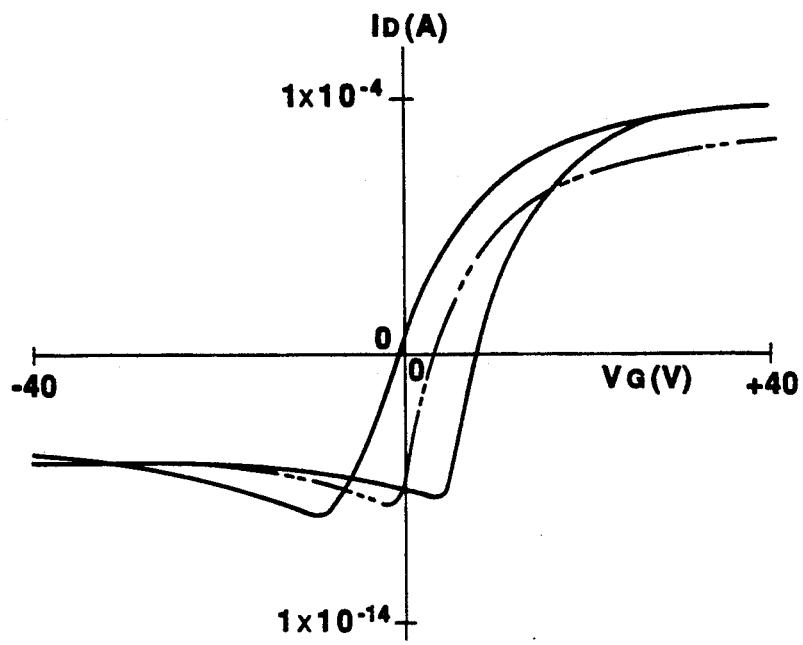
FIG. 35 is a graph showing I-V characteristics of a TFT manufactured by the method of the present invention.
Figure 36:
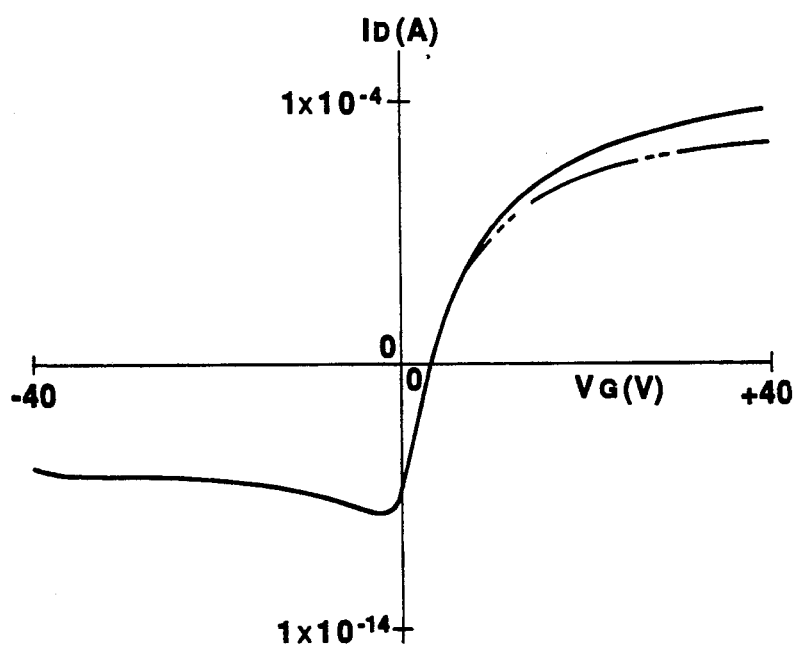
FIG. 36 is a graph showing I-V characteristics of the TFT shown in FIG. 33.

FIGS. 35 and 36 show $V_G$-$I_D$ characteristic curves (solid curves) of a thin film transistor having the gate insulating film 503 consisting of only a silicon nitride film having a larger number of silicon atoms than that represented by the stoichiometric ratio and a thin film transistor having the gate insulating film 503 consisting of both silicon nitride films 503a, 503b having a larger number of silicon atoms than that represented by the stoichiometric ratio and the silicon nitride film 503b having a larger number of nitrogen atoms than that represented by the stoichiometric ratio. When the gate insulating film consists of only a silicon nitride film having a larger number of silicon atoms, hysteresis characteristics appear in the $V_G$-$I_D$ characteristic curve as shown in FIG. 35. However, when the gate insulating film 503 also has the silicon nitride film 503b which has a larger number of nitrogen atoms and which is formed at the interface of the gate insulating film 503 with the semiconductor layer 504. the $V_G$-$I_D$ characteristic curve does not have any hysteresis, as shown in FIG. 36.

The thickness of the silicon nitride film 503b having a larger number of nitrogen atoms is sufficiently about 100 Å. Even if the silicon nitride film 503b is formed on the surface of the silicon nitride film (thickness: about 1,000 Å) 503a, the total thickness of the insulating film is about 1,100 Å. The ON current of the thin film transistor of the fifth embodiment is sufficiently larger than that of the conventional thin film transistor (gate insulating film thickness: 3,000 to 4,000 Å) having the $V_G$-$I_D$ characteristic curve indicated by the alternate long and two short dashed line in FIG. 36.

In this embodiment, since the Si-rich nitride film 503a and the N-rich nitride film 503b formed near the semiconductor layer 504 are formed by the plasma CVD apparatus at the RF discharge power densities of 84 mW/cm$^2$ and 127 mW/cm$^2$, respectively, these silicon nitride films 503a and 503b can be continuously formed by the plasma CVD apparatus.

In the fifth embodiment, a silicon nitride film having a larger number of silicon atoms and serving as the gate insulating film 503 is formed at the RF discharge power density of 84 mW/cm$^2$. However, this silicon nitride film can be formed within the discharge power density range of 60 to 100 mW/cm$^2$. Any silicon nitride film formed within this range of the discharge power density has a high breakdown voltage.

In addition, a silicon nitride film having a larger number of nitrogen atoms and serving as the silicon nitride film 503b at the interface with the semiconductor layer 504 may be formed at an RF discharge power density of 110 mW/cm$^2$ or more. However, a preferable discharge power density for forming this silicon nitride film is a maximum of about 250 mW/cm$^2$. The Si-rich nitride film 503a and N-rich nitride film 503b may be formed in the aforementioned step of forming the gate insulating film 503, by changing the composition of the process gas after the formation of the insulating film.

The thin film transistor of this embodiment is of an inverted staggered type. However, the present invention is equally applicable to staggered, coplanar, and inverted coplanar type thin film transistors, as a matter of course.

What is claimed is:

1. A thin-film transistor comprising:
   an insulating substrate;
   a non-single-crystal silicon semiconductor film placed above said substrate;
   an insulating film placed on said semiconductor film; and
   at least three electrodes including a pair of first electrodes and a second electrode, the pair of first electrodes being spaced a specified distance apart in a plane and electrically connected to said semiconductor film so as to form the channel region of the transistor therebetween, the second electrode being placed to sandwich at least said insulating film between itself and said pair of first electrodes, either said first electrode pair or said second electrode being formed on said substrate, and at least the electrode or electrode pair on said substrate being made of titanium-containing aluminum.

2. A thin-film transistor according to claim 1, wherein said three electrodes include said second electrode formed of titanium-containing aluminum on said substrate, and said pair of first electrodes placed above said second electrode so as to sandwich at least said insulating film between itself and said second electrode.

3. A thin-film transistor according to claim 1, wherein said three electrodes include said pair of first electrodes formed of titanium-containing aluminum on said substrate, and said second electrode placed above said pair of first electrodes so as to sandwich at least said insulating film between itself and said pair of first electrodes.

4. A thin-film transistor according to claim 1, wherein said insulating film is a single layer of a nitride film.

5. A thin-film transistor according to claim 4, wherein said nitride film is a silicon nitride film formed in the substrate temperature range of 230° to 270° C.

6. A thin-film transistor according to claim 4, wherein said nitride film is a silicon nitride film formed in the substrate temperature range of 350° to 370° C.; and said electrode or electrode pair on the substrate is made of titanium-containing aluminum with a titanium content of 4.2% or more by weight.

7. A thin-film transistor according to claim 1, wherein said insulating film comprises a plurality of insulating layers made of oxide and nitride.

8. A thin-film transistor according to claim 7, wherein said insulating film comprises a metal oxide layer formed by anodizing the surface of said electrode or electrode pair on said substrate and a silicon nitride layer formed on the metal oxide layer.

9. A thin-film transistor according to claim 7, wherein said insulating film has a three-layer structure consisting of a first insulating layer of silicon nitride, a second insulating layer of metal oxide, and a third insulating layer of silicon nitride stacked in that order.

10. A thin-film transistor according to claim 9, wherein said metal oxide is made of tantalum oxide.

11. A thin-film transistor according to claim 2, further comprising:
    a blocking layer formed on the surface of said semiconductor film so as to separate said pair of first electrodes from each other.

12. A thin-film transistor panel used for active matrix display devices, comprising:
    a transparent insulating substrate;
    thin-film transistors which are arranged in rows and columns on said substrate and each of which comprises a non-single-crystal silicon semiconductor film arranged above said substrate, an insulating film on said semiconductor film, at least three electrodes including a pair of first electrodes and a second electrode, the pair of first electrodes being spaced a specified distance apart in a plane and electrically connected to said semiconductor film so as to form a channel region of the transistor, the second electrode being arranged to sandwich at least said insulating film between itself and the pair of first electrodes, either the first electrodes or the second electrode being arranged on said substrate to form a lower-layer electrode or electrode pair, at least the lower-layer electrode of electrode pair being made of titanium-containing aluminum with a titanium content of 2.2% or more by weight;
    a plurality of control signal lines which are formed so as to extend in the row or column direction and which connect to the second electrodes of the thin-film transistors arranged in a matrix on a row or column basis to supply control signals to said thin-film transistors;
    a plurality of data signal lines which are formed to extend in the row or column direction and which connect to one of each pair of first electrodes of the thin-film transistors arranged in matrix on a row or column basis to supply data signals to said thin-film transistors; and
    transparent pixel electrodes on said substrate and arranged to correspond to said individual thin-film transistors and which are connected to the other of each pair of first electrodes so that data signals are applied to the pixel electrodes via said thin-film transistors.

13. A thin-film transistor panel according to claim 12, wherein of said control signal lines and data signal lines, at least said control signal lines are made of titanium-containing aluminum.

14. A thin-film transistor panel according to claim 12, wherein the electrodes of each of said thin-film transistors include said second electrode formed out of titanium-containing aluminum on said substrate and said pair of first electrodes placed above the second electrode to sandwich at least said insulating film between itself and the second electrode.

15. A thin-film transistor panel according to claim 12, wherein said insulating film comprises a metal oxide layer formed by anodizing the surface of said lower-layer electrode or electrode pair and a silicon nitride layer formed on the metal oxide layer.

16. A thin-film transistor panel according to claim 13, wherein said second electrode, said control signal lines, and said data signal lines are covered with an oxide insulating film made of aluminum oxide formed by anodizing the surfaces of those electrode and lines, with a silicon nitride film still covering the oxide insulating film.

17. A liquid-crystal matrix display device using thin-film transistors, comprising:
    a first transparent insulating substrate;
    a plurality of gate lines made of titanium-containing aluminum with a titanium content of 2.2% or more by weight and arranged to extend in a row or column direction on said first substrate;

a plurality of gate electrodes formed out of titanium-containing aluminum with a titanium content of 2.2% or more by weight on said first substrate and arranged to connect to the individual gate lines;

a gate insulating film which is formed substantially over said first substrate to cover said plurality of gate lines and gate electrodes and which receives a control signal;

a non-single-crystal silicon semiconductor film arranged on said gate insulating film to cover said gate electrode;

drain and source electrodes spaced a specified distance apart on said semiconductor film and electrically connected to said semiconductor film to form a channel region of a transistor;

a plurality of data lines on said gate insulating film and arranged to cross said gate lines at right angles and which connect to said plurality of drain electrodes to receive data signals;

transparent pixel electrodes arranged in rows and columns on said gate insulating film and connected to said individual source electrodes;

a second substrate a specified distance apart from said first substrate to face each other and bonded one another with seal material;

at least one opposite electrode formed on the surface of said second substrate facing said first substrate to face more than one of said pixel electrodes; and liquid crystal sealed in a region enclosed by said first substrate, second substrate, and seal member and oriented in a specified state.

18. A liquid-crystal matrix display device according to claim 17, wherein said gate insulating film is a silicon nitride film formed in the temperature range of 230° to 270° C.

19. A liquid-crystal matrix display device according to claim 17, wherein said gate insulating film comprises a metal oxide layer formed by anodizing the surfaces of said gate electrode and gate lines and a silicon nitride layer formed on the metal oxide layer.

* * * * *